(12) United States Patent
Reiss et al.

(10) Patent No.: US 10,073,137 B2
(45) Date of Patent: Sep. 11, 2018

(54) SOUNDWIRE-BASED EMBEDDED DEBUGGING IN AN ELECTRONIC DEVICE

(71) Applicant: QUALCOMM Incorporated, San Diego, CA (US)

(72) Inventors: Oren Reiss, Haifa (IL); Lior Amarilio, Yokneam (IL); Amit Gil, Zichron Yaakov (IL); Boaz Moskovich, Haifa (IL)

(73) Assignee: QUALCOMM Incorporated, San Diego, CA (US)

( * ) Notice: Subject to any disclaimer, the term of this patent is extended or adjusted under 35 U.S.C. 154(b) by 1 day.

(21) Appl. No.: 15/226,482

(22) Filed: Aug. 2, 2016

(65) Prior Publication Data

US 2018/0038908 A1    Feb. 8, 2018

(51) Int. Cl.
*G01R 31/28* (2006.01)
*G01R 31/317* (2006.01)
*G01R 31/3177* (2006.01)

(52) U.S. Cl.
CPC ..... *G01R 31/2884* (2013.01); *G01R 31/3177* (2013.01); *G01R 31/31705* (2013.01)

(58) Field of Classification Search
CPC .......... G01R 31/2884; G01R 31/31705; G01R 31/3177
See application file for complete search history.

(56) References Cited

U.S. PATENT DOCUMENTS 7,257,654 B1 * 8/2007 Reeves .......... G01R 31/318555
326/38

8,677,306 B1 * 3/2014 Andreev ............... G06F 11/267
714/30

(Continued)

FOREIGN PATENT DOCUMENTS

EP        1139108 B1      3/2006

OTHER PUBLICATIONS

Author Unknown, "MIPI SoundWire Master Controller IP," Cadence, MIPI Datasheet, Sep. 30, 2014, 3 pages, Retrieved from the Internet: URL: http://ip.cadence.com/uploads/584/Cadence_MIPI_SoundWire_Master Controller_ds_v2-0.pdf.

(Continued)

*Primary Examiner* — Kyle Vallecillo
(74) *Attorney, Agent, or Firm* — Withrow & Terranova, PLLC

(57) ABSTRACT

SoundWire-based embedded debugging in an electronic system is provided. In this regard, in one aspect, a SoundWire slave circuit receives a SoundWire data input signal over a SoundWire bus including two physical wires. The SoundWire data input signal includes a plurality of debug configuration bits in assigned SoundWire bitslots. The SoundWire slave circuit generates a plurality debug input bits required for debugging the SoundWire slave circuit based on the debug configuration bits received in the assigned SoundWire bitslots. In another aspect, the SoundWire slave circuit returns a SoundWire data output signal, which includes a debug output bit in an assigned SoundWire bitslot, over the SoundWire bus. By receiving debugging configurations and returning debugging results over the SoundWire bus, it is possible to debug the SoundWire slave circuit with a reduced number of physical pins, thus helping to reduce the overall pin count and footprint of the electronic device.

42 Claims, 11 Drawing Sheets

(56) References Cited

U.S. PATENT DOCUMENTS

| | | |
|---|---|---|
| 2002/0133795 A1 | 9/2002 | Yamada |
| 2004/0204912 A1* | 10/2004 | Nejedlo ............ G01R 31/31717 702/188 |
| 2007/0140287 A1 | 6/2007 | Houlihane et al. |
| 2012/0047576 A1* | 2/2012 | Do ....................... G06F 12/1483 726/22 |
| 2012/0233504 A1 | 9/2012 | Patil et al. |
| 2014/0340527 A1* | 11/2014 | Wu ........................... G06F 13/28 348/180 |
| 2015/0254154 A1 | 9/2015 | Zilbershtein et al. |
| 2016/0018462 A1* | 1/2016 | Menon .................... G01R 31/40 714/731 |
| 2016/0105750 A1 | 4/2016 | Cagdaser et al. |
| 2016/0124892 A1 | 5/2016 | Amarilio et al. |

OTHER PUBLICATIONS

Author Unknown, "MIPI Test and Debug Interface Framework—White Paper," Version 3.2, Apr. 7, 2006, 11 pages.

Author Unknown, "Specification for SoundWire," MIPI Alliance, Version 1.0, Jan. 21, 2015, 289 pages.

Ley, Adam W., "Doing More with Less—An IEEE 1149.7 Embedded Tutorial: Standard for Reduced-pin and Enhanced-functionality Test Access Port and Boundary-Scan Architecture," International Test Conference, Paper ET3.1, Nov. 1, 2009, IEEE, 10 pages.

International Search Report and Written Opinion for PCT/US2017/043514, dated Oct. 24, 2017, 20 pages.

Second Written Opinion for PCT/US2017/043514, dated Jun. 27, 2018, 11 pages.

* cited by examiner

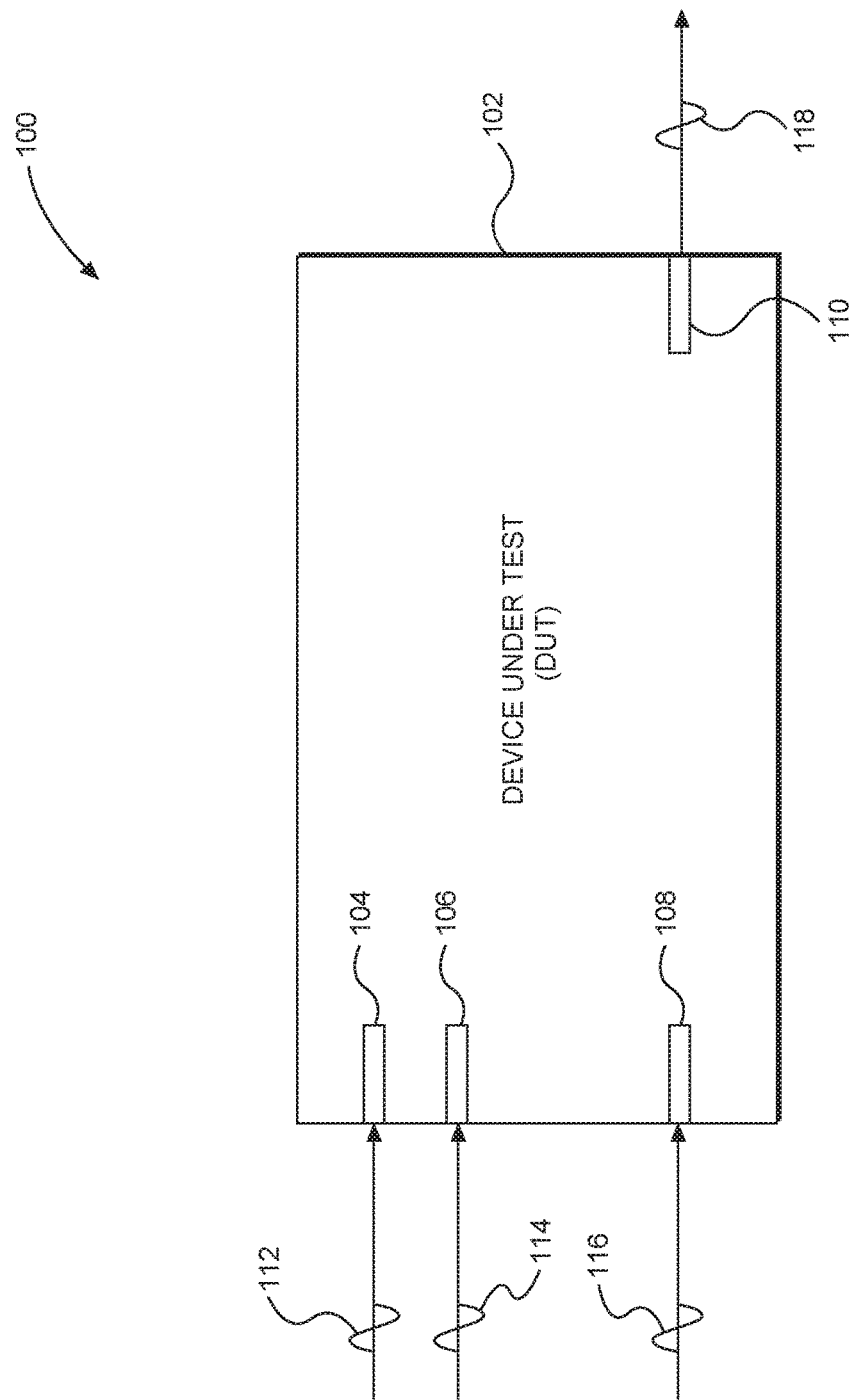

SOUNDWIRE-BASED EMBEDDED DEBUGGING IN AN ELECTRONIC DEVICE

BACKGROUND

I. Field of the Disclosure

The technology of the disclosure relates generally to embedded debugging in an electronic device.

II. Background

Mobile computing devices have become common in modern society. The prevalence of mobile computing devices may be attributed to the many functions that are enabled within such computing devices. Increasingly complex integrated circuits (ICs) have been designed and manufactured to provide increasingly greater functionality in mobile computing devices. In some cases, an entire system of a mobile computing device is integrated into a single IC known as a system-on-chip (SOC). In some other cases, the entire system of the mobile computing device is supported by multiple ICs that are packaged into an integrated module known as system-in-package (SIP).

ICs and mobile computing devices are repeatedly tested and debugged during different phases of their respective development life cycles in an effort to detect and eliminate potential errors before releasing the mobile computing devices to customers. While testing is a process for detecting suspected errors under specific conditions, debugging is a process used to investigate the exact causes of the suspected errors. A de facto debugging approach involves analyzing execution logs obtained under various test conditions from a device under test (DUT). The Joint Test Action Group (JTAG) and the Institute of Electrical and Electronics Engineers (IEEE) have established standard debugging methodologies (e.g., IEEE Standard 1149.1) and tools for debugging mobile computing devices and the ICs therein. As the complexity of mobile computing devices continues to increase and the size of ICs continues to decrease, testing and debugging are becoming more cumbersome and time consuming. Accordingly, designers and developers of mobile computing devices require better testing and debugging tools. Further, it may be desirable to perform embedded debugging without increasing the cost and footprint of mobile computing devices.

SUMMARY OF THE DISCLOSURE

Aspects disclosed in the detailed description include SoundWire-based embedded debugging in an electronic system. SoundWire is a MIPI Alliance specification for transporting data typically related to audio functions between a SoundWire master (e.g., application processor) and a SoundWire slave(s) (e.g., microphone and codec) over a SoundWire bus including two physical wires. In this regard, in one aspect, a SoundWire slave circuit in an electronic device receives a SoundWire data input signal over the SoundWire bus. The SoundWire data input signal includes a plurality of debug configuration bits in assigned SoundWire bitslots. The SoundWire slave circuit generates a plurality of debug input bits required for debugging a device under test (DUT) in the electronic device based on the debug configuration bits received in the assigned SoundWire bitslots. In another aspect, the SoundWire slave circuit returns a SoundWire data output signal, which includes a debug output bit in an assigned SoundWire bitslot, over the SoundWire bus. By receiving debugging configurations and returning debugging results over the SoundWire bus, it is possible to debug the DUT in the electronic device with a reduced number of physical pins (e.g., without exposing dedicated debug pins), thus helping to reduce the overall pin count and footprint of the electronic device.

In this regard, in one aspect, a SoundWire slave circuit in an electronic device is provided. The SoundWire slave circuit includes slave SoundWire circuitry including a slave receive interface and a slave transmit interface. The slave SoundWire circuitry is configured to receive a SoundWire data input signal over a SoundWire bus and provide the SoundWire data input signal to the slave receive interface. The slave SoundWire circuitry is also configured to receive a SoundWire data output signal from the slave transmit interface and transmit the SoundWire data output signal over the SoundWire bus. The SoundWire slave circuit also includes slave debug circuitry. The slave debug circuitry is configured to receive the SoundWire data input signal including a plurality of debug configuration bits in a plurality of assigned debug configuration bitslots from the slave receive interface. The slave debug circuitry is also configured to generate a plurality of debug input bits based on the plurality of debug configuration bits in the plurality of assigned debug configuration bitslots. The slave debug circuitry is also configured to provide the SoundWire data output signal including a debug output bit in an assigned debug output bitslot to the slave transmit interface.

In another aspect, a SoundWire slave circuit in an electronic device is provided. The SoundWire slave circuit includes a means for providing SoundWire communication including a slave receive interface and a slave transmit interface. The means for providing SoundWire communication is configured to receive a SoundWire data input signal over a SoundWire bus and provide the SoundWire data input signal to the slave receive interface. The means for providing SoundWire communication is also configured to receive a SoundWire data output signal from the slave transmit interface and transmit the SoundWire data output signal over the SoundWire bus. The SoundWire slave circuit also includes a means for debugging the SoundWire slave circuit. The means for debugging the SoundWire slave circuit is configured to receive the SoundWire data input signal including a plurality of debug configuration bits in a plurality of assigned debug configuration bitslots from the slave receive interface. The means for debugging the SoundWire slave circuit is also configured to generate a plurality of debug input bits based on the plurality of debug configuration bits in the plurality of assigned debug configuration bitslots. The means for debugging the SoundWire slave circuit is also configured to provide the SoundWire data output signal including a debug output bit in an assigned debug output bitslot to the slave transmit interface.

In another aspect, a method for enabling SoundWire-based embedded debugging on a SoundWire slave circuit over a SoundWire bus is provided. The method includes receiving a SoundWire data input signal including a plurality of debug configuration bits in a plurality of assigned debug configuration bitslots at the SoundWire slave circuit over the SoundWire bus. The method also includes generating a plurality of debug input bits based on the plurality of debug configuration bits in the plurality of assigned debug configuration bitslots. The method also includes transmitting a SoundWire data output signal including a debug output bit in an assigned debug output bitslot from the SoundWire slave circuit over the SoundWire bus.

In another aspect, a SoundWire master circuit in an electronic device is provided. The SoundWire master circuit includes master SoundWire circuitry including a master receive interface and a master transmit interface. The master SoundWire circuitry is configured to receive a SoundWire data input signal from the master transmit interface and transmit the SoundWire data input signal over a SoundWire bus. The master SoundWire circuitry is also configured to receive a SoundWire data output signal over the SoundWire bus and provide the SoundWire data output signal to the master receive interface. The SoundWire master circuit also includes master debug circuitry. The master debug circuitry is configured to receive a plurality of debug input bits and generate a plurality of debug configuration bits based on the plurality of debug input bits. The master debug circuitry is also configured to generate the SoundWire data input signal including the plurality of debug configuration bits in a plurality of assigned debug configuration bitslots. The master debug circuitry is also configured to provide the SoundWire data input signal to the master transmit interface. The master debug circuitry is also configured to receive the SoundWire data output signal including a debug output bit in an assigned debug output bitslot from the master receive interface. The master debug circuitry is also configured to retrieve the debug output bit from the SoundWire data output signal.

In another aspect, a method for exchanging debug information with a SoundWire master circuit over a SoundWire bus is provided. The method includes receiving a plurality of debug input bits and generating a plurality of debug configuration bits based on the plurality of debug input bits. The method also includes generating a SoundWire data input signal including the plurality of debug configuration bits in a plurality of assigned debug configuration bitslots over the SoundWire bus. The method also includes receiving a SoundWire data output signal including a debug output bit in an assigned debug output bitslot over the SoundWire bus. The method also includes retrieving the debug output bit from the SoundWire data output signal.

In another aspect, an electronic device is provided. The electronic device includes a SoundWire master circuit. The SoundWire master circuit includes master SoundWire circuitry including a master receive interface and a master transmit interface. The master SoundWire circuitry is configured to receive a SoundWire data input signal from the master transmit interface and transmit the SoundWire data input signal over a SoundWire bus. The master SoundWire circuitry is also configured to receive a SoundWire data output signal over the SoundWire bus and provide the SoundWire data output signal to the master receive interface. The SoundWire master circuit also includes master debug circuitry. The master debug circuitry is configured to receive a plurality of debug input bits and generate a plurality of debug configuration bits based on the plurality of debug input bits. The master debug circuitry is also configured to generate the SoundWire data input signal including the plurality of debug configuration bits in a plurality of assigned debug configuration bitslots. The master debug circuitry is also configured to provide the SoundWire data input signal to the master transmit interface. The master debug circuitry is also configured to receive the SoundWire data output signal including a debug output bit in an assigned debug output bitslot from the master receive interface. The master debug circuitry is also configured to retrieve the debug output bit from the SoundWire data output signal. The electronic device also includes a SoundWire slave circuit. The SoundWire slave circuit includes slave SoundWire circuitry including a slave receive interface and a slave transmit interface. The slave SoundWire circuitry is configured to receive the SoundWire data input signal including the plurality of debug configuration bits in the plurality of assigned debug configuration bitslots over the SoundWire bus. The slave SoundWire circuitry is also configured to provide the SoundWire data input signal to the slave receive interface. The slave SoundWire circuitry is also configured to receive the SoundWire data output signal including the debug output bit in the assigned debug output bitslot from the slave transmit interface. The slave SoundWire circuitry is also configured to transmit the SoundWire data output signal over the SoundWire bus. The SoundWire slave circuit also includes slave debug circuitry. The slave debug circuitry is configured to receive the SoundWire data input signal from the slave receive interface. The slave debug circuitry is also configured to generate the plurality of debug input bits based on the plurality of debug configuration bits in the plurality of assigned debug configuration bitslots. The slave debug circuitry is also configured to provide the SoundWire data output signal including the debug output bit in the assigned debug output bitslot to the slave transmit interface.

In another aspect, a SoundWire slave circuit in an electronic device is provided. The SoundWire slave circuit is configured to receive a SoundWire data input signal including a plurality of debug configuration bits in a plurality of assigned debug configuration bitslots over a SoundWire bus. The SoundWire slave circuit is also configured to transmit a SoundWire data output signal including a debug output bit in an assigned debug output bitslot over the SoundWire bus.

In another aspect, a SoundWire master circuit in an electronic device is provided. The SoundWire master circuit is configured to transmit a SoundWire data input signal including a plurality of debug configuration bits in a plurality of assigned debug configuration bitslots over a SoundWire bus. The SoundWire master circuit is also configured to receive a SoundWire data output signal including a debug output bit in an assigned debug output bitslot over the SoundWire bus.

BRIEF DESCRIPTION OF THE FIGURES

FIG. 1A is a schematic diagram of a Joint Test Action Group (JTAG) embedded test configuration;

DETAILED DESCRIPTION

Figure 1B:
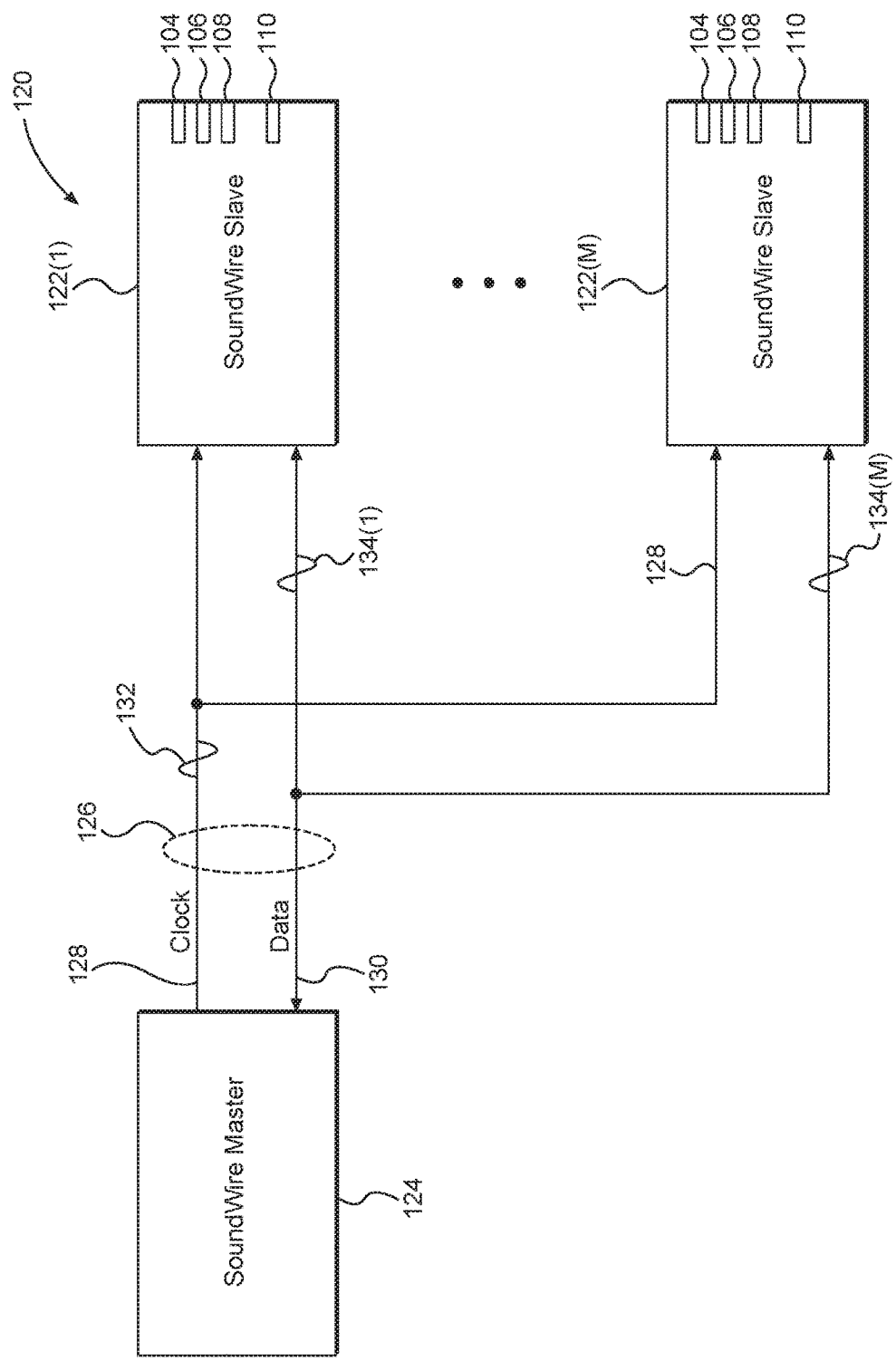
FIG. 1B is a schematic diagram of an exemplary standard SoundWire system configured to perform embedded tests on one or more SoundWire slave circuits based on the JTAG embedded test configuration of FIG. 1A.

With reference now to the drawing figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

Aspects disclosed in the detailed description include SoundWire-based embedded debugging in an electronic system. SoundWire is a MIPI Alliance specification for transporting data typically related to audio functions between a SoundWire master (e.g., application processor) and a SoundWire slave(s) (e.g., microphone and codec) over a SoundWire bus including two physical wires. In this regard, in one aspect, a SoundWire slave circuit in an electronic device receives a SoundWire data input signal over the SoundWire bus. The SoundWire data input signal includes a plurality of debug configuration bits in assigned SoundWire bitslots. The SoundWire slave circuit generates a plurality debug input bits required for debugging a device under test (DUT) in the electronic device based on the debug configuration bits received in the assigned SoundWire bitslots. In another aspect, the SoundWire slave circuit returns a SoundWire data output signal, which includes a debug output bit in an assigned SoundWire bitslot, over the SoundWire bus. By receiving debugging configurations and returning debugging results over the SoundWire bus, it is possible to debug the DUT in the electronic device with a reduced number of physical pins (e.g., without exposing dedicated debug pins), thus helping to reduce the overall pin count and footprint of the electronic device.

Before discussing exemplary aspects of SoundWire-based embedded debugging in an electronic device that includes specific aspects of the present disclosure, a brief overview of a Joint Action Test Group (JTAG) embedded test configuration is first provided in FIG. 1A. A brief overview of a standard SoundWire system based on the JTAG embedded test configuration and an exemplary SoundWire frame format are then discussed with reference to FIGS. 1B and 1C, respectively. The discussion of specific exemplary aspects of SoundWire-based embedded debugging in an electronic device starts with reference to FIG. 2.

In this regard, FIG. 1A is a schematic diagram of a JTAG embedded test configuration 100. To perform embedded tests on a device under test (DUT) 102 based on the JTAG embedded test configuration 100, the DUT 102 is required to provide a test clock (TCK) pin 104, a test mode select (TMS) pin 106, a test data input (TDI) pin 108, and a test data output (TDO) pin 110. The TCK pin 104, the TMS pin 106, the TDI pin 108, and the TDO pin 110 are collectively referred to as the "external debug pins" hereinafter.

The TCK pin 104 is configured to receive a TCK bit(s) 112, the TMS pin 106 is configured to receive a TMS bit(s) 114, the TDI pin 108 is configured to receive a TDI bit(s) 116, and the TDO pin 110 is configured to output a TDO bit(s) 118. In this regard, the TCK bit(s) 112, the TMS bit(s) 114, and the TDI bit(s) 116 configure and control the DUT 102 for performing the embedded test. The TDO bit(s) 118 carries debug log(s) obtained from the embedded test. As such, to perform the embedded test based on the JTAG embedded test configuration 100, the DUT 102 needs to expose the external debug pins for external access.

The JTAG embedded test configuration 100 may be employed to perform embedded tests in a SoundWire system. In this regard, FIG. 1B is a schematic diagram of an exemplary standard SoundWire system 120 configured to perform embedded tests on one or more SoundWire slave circuits 122(1)-122(M) based on the JTAG embedded test configuration 100 of FIG. 1A. Common elements between FIGS. 1A and 1B are shown therein with common element numbers and will not be re-described herein.

With reference to FIG. 1B, the standard SoundWire system 120 includes a SoundWire master circuit 124. The SoundWire master circuit 124 is connected to the SoundWire slave circuits 122(1)-122(M) via a SoundWire bus 126. In a non-limiting example, the SoundWire slave circuits 122(1)-122(M) include audio amplifiers (e.g., speaker, microphone, etc.), audio codec, and so on. The SoundWire bus 126 includes a clock line 128 and a data line 130. In this regard, the SoundWire bus 126 includes two physical wires configured to function as the clock line 128 and the data line 130, respectively. According to the MIPI Alliance Specification for SoundWire, version 1.0, published on Jan. 21, 2015 (SoundWire Specification), the SoundWire bus 126 may include additional physical wires to provide up to eight (8) data lines. For the convenience of illustration, the SoundWire bus 126 is shown herein to include only the data line 130. It shall be appreciated that it is possible for the SoundWire bus 126 to include additional data lines according to the SoundWire Specification.

The SoundWire master circuit 124 is configured to provide a clock signal 132 to the SoundWire slave circuits 122(1)-122(M) over the clock line 128. The data line 130 can be configured to carry one or more bidirectional data signals 134(1)-134(M) between the SoundWire master circuit 124 and the SoundWire slave circuits 122(1)-122(M) based on time-division multiplexing (TDM). The bidirectional data signals 134(1)-134(M) are communicated based on SoundWire frames, which is discussed next with reference to FIG. 1C.

Figure 1C:
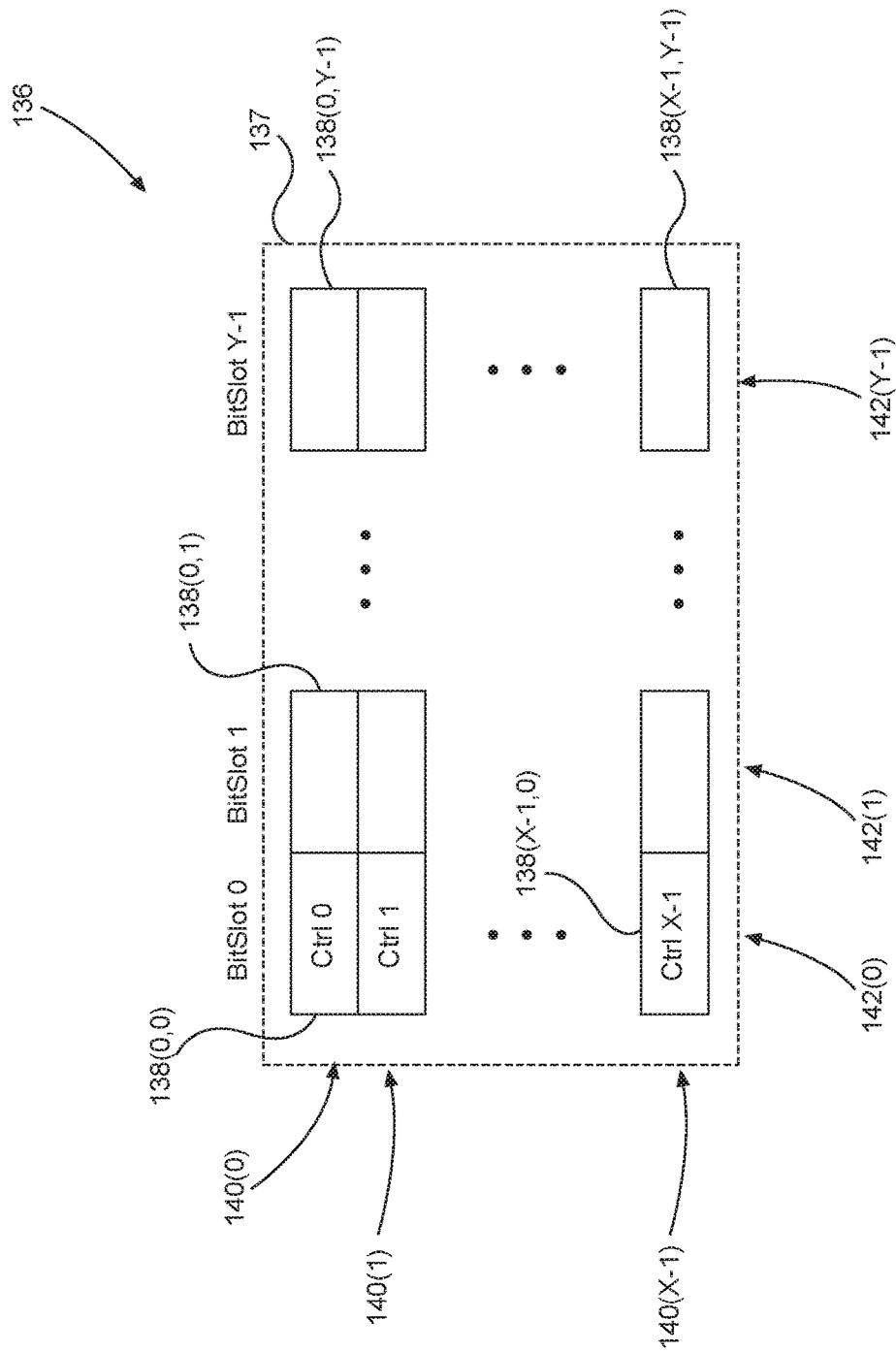
FIG. 1C is a schematic diagram of an exemplary SoundWire frame as defined in the MIPI Alliance Specification for SoundWire, version 1.0 published on Jan. 21, 2015.

In this regard, FIG. 1C is a schematic diagram of an exemplary SoundWire frame 136 as defined in the SoundWire Specification. According to the SoundWire Specification, the SoundWire frame 136 includes at least one SoundWire frame shape 137. The SoundWire frame shape 137 includes a plurality of bitslots 138(0,0)-138(X-1,Y-1) organized into X rows 140(0)-140(X-1) and Y columns 142(0)-142(Y-1). The SoundWire Specification requires the SoundWire frame shape 137 to include at least forty-eight (48) rows. The first bitslot (represented as "BitSlot 0" in FIG. 1C) in each of the rows 140(1)-140(X-1) is external to carry a control bit.

With reference back to FIG. 1B, to perform embedded tests on the SoundWire slave circuits 122(1)-122(M) based on the JTAG embedded test configuration 100 of FIG. 1A, each of the SoundWire slave circuits 122(1)-122(M) needs to expose the external debug pins. However, it may not be possible to provide external debug pins in each of the SoundWire slave circuits 122(1)-122(M) due to a limited system-on-chip (SOC) dimension. Even if the SOC dimension allows the external debug pins to be added in each of the SoundWire slave circuits 122(1)-122(M), adding the external debug pins may lead to increased footprint, cost, power consumption, and design complexity. Hence, it may be desirable to perform embedded JTAG debugging without adding the external debug pins required in the JTAG embedded test configuration 100 of FIG. 1A.

Figure 2:
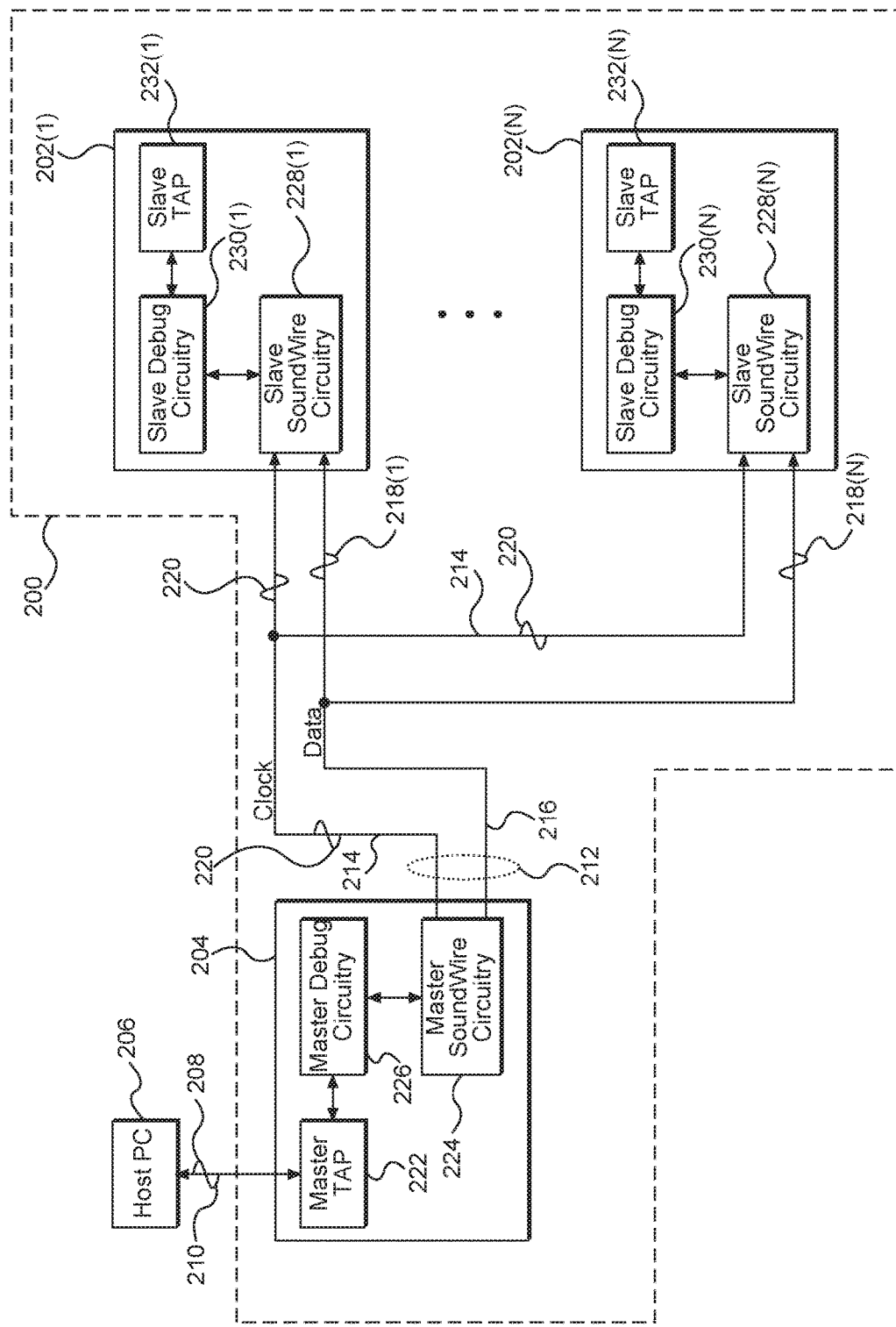
FIG. 2 is a schematic diagram of an exemplary electronic device configured to perform SoundWire-based embedded debugging on one or more SoundWire slave circuits without exposing dedicated debug pins in the SoundWire slave circuits.

In this regard, FIG. 2 is a schematic diagram of an exemplary electronic device 200 configured to perform SoundWire-based embedded debugging on one or more SoundWire slave circuits 202(1)-202(N) without exposing dedicated debug pins in the SoundWire slave circuits 202(1)-202(N). With reference to FIG. 2, the electronic device 200 includes a SoundWire master circuit 204. The SoundWire master circuit 204 is communicatively coupled to a host personal computer (PC) 206. The host PC 206 provides debug configuration parameters 208 to the SoundWire slave circuits 202(1)-202(N) and receives debug results 210 from the SoundWire slave circuits 202(1)-202(N) via the SoundWire master circuit 204. The host PC 206 may present the debug results 210 to a tester(s) via a graphical user interface (GUI) (not shown). The SoundWire master circuit 204 is coupled to the SoundWire slave circuits 202(1)-202(N) over a SoundWire bus 212. The SoundWire bus 212 includes a clock line 214 and at least one data line 216. It shall be appreciated that the SoundWire bus 212 may include additional data lines according to the SoundWire Specification. The data line 216 is configured to carry one or more bidirectional data signals 218(1)-218(N) between the SoundWire master circuit 204 and the SoundWire slave circuits 202(1)-202(N) using the SoundWire frame 136 of FIG. 1C (not shown). The SoundWire master circuit 204 distributes a clock signal 220 to the SoundWire slave circuits 202(1)-202(N) over the clock line 214. The clock signal 220 helps the SoundWire slave circuits 202(1)-202(N) to maintain synchronization with the SoundWire master circuit 204 to detect boundaries of the SoundWire frame 136. In this regard, the SoundWire slave circuits 202(1)-202(N) may not be functional without the SoundWire master circuit 204.

The SoundWire master circuit 204 receives the debug configuration parameters 208 from the host PC 206 for debugging a DUT (not shown) in the electronic device 200, and communicates the debug configuration parameters 208 to the SoundWire slave circuits 202(1)-202(N) over the SoundWire bus 212. In a non-limiting example, the DUT can be any of the SoundWire slave circuits 202(1)-202(N) or non-SoundWire circuitries (not shown) in the electronic device 200. The SoundWire master circuit 204 transmits the debug configuration parameters 208 to at least one of the SoundWire slave circuits 202(1)-202(N) in an assigned debug configuration bitslot(s) in the SoundWire frame 136. The SoundWire slave circuits 202(1)-202(N) retrieve the debug configuration parameters 208 from the assigned debug configuration slot(s) in the received SoundWire frame 136 for carrying out SoundWire-based embedded debugging in the DUT accordingly. The SoundWire slave circuits 202(1)-202(N) provide the debug results 210 to the SoundWire master circuit 204 in an assigned debug output bitslot(s) in the SoundWire frame 136. The SoundWire master circuit 204 receives the debug results 210 from the SoundWire slave circuits 202(1)-202(N) over the SoundWire bus 212 and provides the debug results 210 to the host PC 206. Exemplary illustration of the assigned debug configuration bitslot(s) and the assigned debug output bitslot(s) in the SoundWire frame 136 is provided later with reference to FIG. 5. By communicating the debug configuration parameters 208 and the debug results 210 in the SoundWire frame 136 over the SoundWire bus 212, it is possible to perform SoundWire-based embedded debugging in the electronic device 200 without exposing dedicated external debug pins in the DUT. As a result, it may be possible to reduce the overall pin count, footprint, power consumption, and design complexity in the electronic device 200.

With continuing reference to FIG. 2, the SoundWire master circuit 204 includes a master test access port (TAP) 222 for interfacing with the host PC 206. The SoundWire master circuit 204 also includes master SoundWire circuitry 224 for communicating the bidirectional data signals 218(1)-218(N) over the SoundWire bus 212. The SoundWire master circuit 204 also includes master debug circuitry 226 configured to multiplex the debug configuration parameters 208 into the assigned debug configuration slot(s) in the SoundWire frame 136. Additional aspects of the SoundWire master circuit 204 will be further discussed later with reference to FIG. 7.

The SoundWire slave circuits 202(1)-202(N) include one or more slave SoundWire circuitries 228(1)-228(N). Each of the slave SoundWire circuitries 228(1)-228(N) is configured to exchange the bidirectional data signals 218(1)-218(N) (e.g., audio data) with the SoundWire master circuit 204 over the SoundWire bus 212. The SoundWire slave circuits 202(1)-202(N) may also include one or more slave debug circuitries 230(1)-230(N). It shall be appreciated that it is not required for all of the SoundWire slave circuits 202(1)-202(N) to include the slave debug circuitries 230(1)-230(N). For example, to perform SoundWire-based embedded debugging on the SoundWire slave circuit 202(1), a DUT communicatively coupled to the SoundWire slave circuit 202(1), or an integrated circuit (IC) in the electronic device 200 including the SoundWire slave circuit 202(1) and the DUT, only the SoundWire slave circuit 202(1) is required to include the slave debug circuitry 230(1). Each of the slave debug circuitries 230(1)-230(N) is configured to de-multiplex the debug configuration parameters 208 from the assigned debug configuration bitslot(s) in the SoundWire frame 136. Further, each of the slave debug circuitries 230(1)-230(N) is configured to multiplex the debug results 210 into the assigned debug output bitslot(s) in the SoundWire frame 136. The SoundWire slave circuits 202(1)-202(N) may also include one or more slave TAPs 232(1)-232(N). The slave TAPs 232(1)-232(N) are configured to interface with respective debugging peripherals (not shown) to carry out SoundWire-based embedded debugging in respective DUTs that are communicatively coupled to the slave TAPs 232(1)-232(N). It shall be appreciated that it is not required for all of the SoundWire slave circuits 202(1)-202(N) to include the slave TAPs 232(1)-232(N). For example, to perform SoundWire-based embedded debugging on the DUT communicatively coupled to (or integrated into the chip containing) the SoundWire slave circuit 202(1), only the SoundWire slave circuit 202(1) is required to include the slave TAP 232(1).

Given that the SoundWire Specification is created for transporting data typically related to audio functions, the SoundWire slave circuits 202(1)-202(N) can include conventional audio circuits for supporting audio devices such as speakers, microphones, audio headsets, etc. However, it is also possible to configure a non-audio circuit (not shown) to function as one of the SoundWire slave circuits 202(1)-202(N) by including one of the slave SoundWire circuitries 228(1)-228(N) in the non-audio circuit. In this regard, it shall be appreciated that the SoundWire slave circuits 202(1)-202(N) are not limited to the conventional audio circuits.

The SoundWire slave circuits 202(1)-202(N) are discussed in further detail next with reference to FIG. 3. For the convenience of illustration, the SoundWire slave circuit 202(1) is referenced hereinafter as a non-limiting example. It shall be appreciated that the configurations and operation principles discussed with reference to the SoundWire slave circuit 202(1) are applicable to rest of the SoundWire slave circuits 202(2)-202(N) as well.

Figure 3:
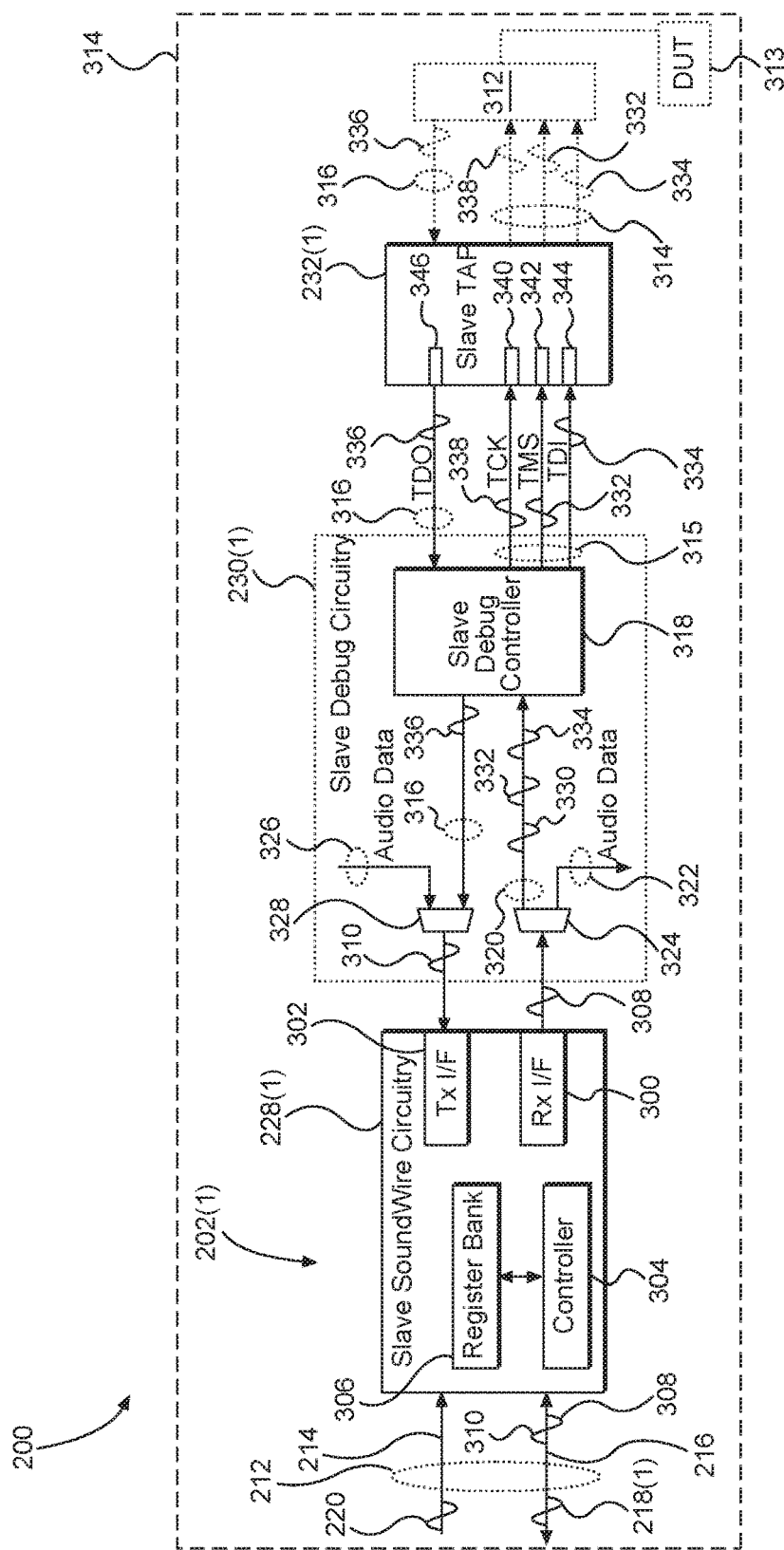
FIG. 3 is a schematic diagram providing an exemplary illustration of a SoundWire slave circuit among the one or more SoundWire slave circuits of FIG. 2 configured to perform SoundWire-based embedded debugging.

In this regard, FIG. 3 is a schematic diagram providing an exemplary illustration of the SoundWire slave circuit 202(1) of FIG. 2 configured to perform SoundWire-based embedded debugging. Common elements between FIGS. 1C, 2 and 3 are shown therein with common element numbers and will not be re-described herein.

With reference to FIG. 3, in a non-limiting example, the slave SoundWire circuitry 228(1) provides a means for providing SoundWire communication, and the slave debug circuitry 230(1) provides a means for debugging the SoundWire slave circuit. The slave SoundWire circuitry 228(1) includes a slave receive interface 300 (abbreviated as Rx I/F in FIG. 3) and a slave transmit interface 302 (abbreviated as Tx I/F in FIG. 3). The slave SoundWire circuitry 228(1) includes a controller 304 and a register bank 306. The controller 304 can be configured to receive a SoundWire data input signal 308 over the SoundWire bus 212 and provide the SoundWire data input signal 308 to the slave receive interface 300. The controller 304 can also be configured to receive a SoundWire data output signal 310 from the slave transmit interface 302 and transmit the SoundWire data output signal 310 over the SoundWire bus 212. The SoundWire data input signal 308 and the SoundWire data output signal 310 include the SoundWire frame 136 (not shown) and are part of the bidirectional data signal 218(1). The controller 304 can be further configured to detect a boundary of the SoundWire frame 136 based on the clock signal 220. The register bank 306 may be used to store commands and/or configuration parameters (e.g., clock gearbox) that the controller 304 can use to configure and control operations of the slave SoundWire circuitry 228(1).

The slave TAP 232(1) is configured to interface with a debug peripheral 312 to carry out SoundWire-based embedded debugging in the electronic device 200. In a first non-limiting example, the debug peripheral 312 is communicatively coupled to a DUT 313, which is a non-SoundWire circuitry in the electronic device 200. In a second non-limiting example, the SoundWire slave circuit 202(1) and the DUT 313 are part of an IC 314 in the electronic device 200. The slave TAP 232(1) receives a plurality of debug input bits 315, which is specific to the debug peripheral 312 for debugging the DUT 313 or the IC 314, from the slave debug circuitry 230(1). In a non-limiting example, the slave TAP 232(1) passes the debug input bits 315 to the debug peripheral 312, and the debug peripheral 312 carries out the SoundWire-based embedded debugging in the DUT 313 or the IC 314 based on the debug input bits 315. The debug peripheral 312 generates a debug output bit 316, which indicates the debug results 210 (not shown), and provides the debug output bit 316 to the slave TAP 232(1). The slave TAP 232(1) in turn provides the debug output bit 316 to the slave debug circuitry 230(1).

The slave debug circuitry 230(1) includes a slave debug controller 318. The slave debug controller 318 receives the SoundWire data input signal 308 from the slave receive interface 300. The SoundWire frame 136 in the SoundWire data input signal 308 includes a plurality of debug configuration bits 320 in a plurality of assigned debug configuration bitslots among the bitslots 138(0,0)-138(X−1,Y−1) (not shown), which are contained in SoundWire frame shape 137 of the SoundWire frame 136. The slave debug controller 318 is configured to generate the debug input bits 315 based on the debug configuration bits 320 and provide the debug input bits 315 to the slave TAP 232(1). The slave debug controller 318 is also configured to receive the debug output bit 316 from the slave TAP 232(1). The slave debug controller 318 inserts the debug output bit 316 into an assigned debug output bitslot among the bitslots 138(0,0)-138(X−1,Y−1) in the SoundWire frame shape 137 of the SoundWire frame 136. The slave debug controller 318 subsequently provides the SoundWire frame 136 to the slave SoundWire circuitry 228(1) in the SoundWire data output signal 310.

The slave debug controller 318 can be configured to enable SoundWire-based embedded debugging on the SoundWire slave circuit 202(1) over the SoundWire bus 212 based on a process. In this regard, FIG. 4 is a flowchart of an exemplary process 400 that may be performed by the slave debug controller 318 in the SoundWire slave circuit 202(1) for enabling SoundWire-based embedded debugging in the SoundWire slave circuit 202(1) over the SoundWire bus 212.

Figure 4:
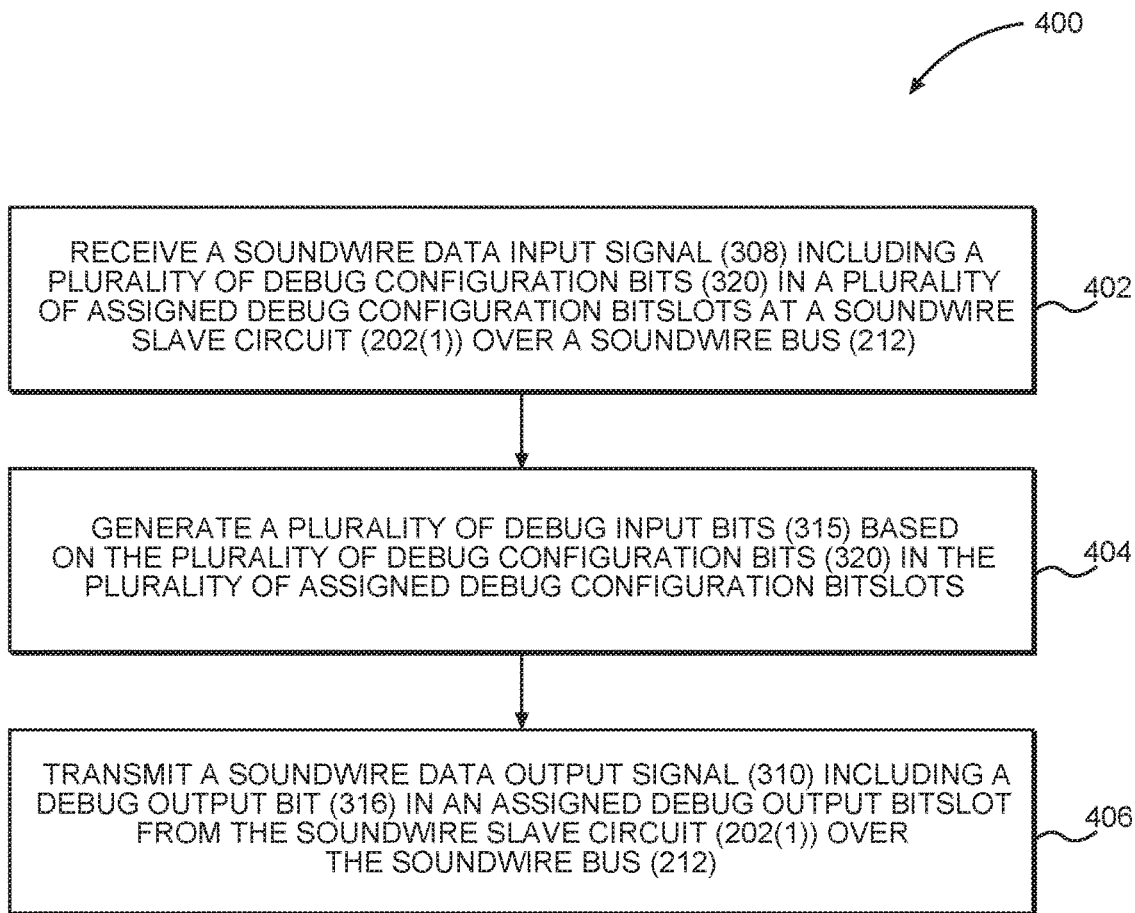
FIG. 4 is a flowchart of an exemplary process that may be performed by a slave debug controller in the SoundWire slave circuit of FIG. 3 for enabling SoundWire-based embedded debugging in the SoundWire slave circuit over a SoundWire bus.

With reference to FIG. 4, the slave debug controller 318 receives the SoundWire data input signal 308 that includes the debug configuration bits 320 in the assigned debug configuration bitslots at the SoundWire slave circuit 202(1) over the SoundWire bus 212 (block 402). The slave debug controller 318 also generates the debug input bits 315 based on the debug configuration bits 320 in the assigned debug configuration bitslots (block 404). The slave debug controller 318 also transmits the SoundWire data output signal 310 that includes the debug output bit 316 in the assigned debug output bitslot from the SoundWire slave circuit 202(1) over the SoundWire bus 212 (block 406).

With reference back to FIG. 3, it may be possible to perform SoundWire-based embedded debugging on the SoundWire slave circuit 202(1) while the SoundWire slave circuit 202(1) is receiving and/or transmitting audio data. This may be particularly important when the SoundWire-based embedded debugging is performed to determine whether the SoundWire slave circuit 202(1) handles the audio data correctly as expected. In this regard, in a non-limiting example, the slave debug circuitry 230(1) receives the SoundWire frame 136 in SoundWire data input signal 308 that further includes a plurality of audio input data bits 322. As such, the slave debug circuitry 230(1) further includes a slave de-multiplexer 324 configured to de-multiplex the SoundWire data input signal 308 to separate the debug configuration bits 320 from the audio input data bits 322. Likewise, the SoundWire frame 136 transmitted in the SoundWire data output signal 310 may include a plurality of audio output data bits 326. Accordingly, the slave debug circuitry 230(1) further includes a slave multiplexer 328 configured to generate the SoundWire data output signal 310 by multiplexing the debug output bit 316 with the audio output data bits 326 into the SoundWire frame 136. Since the debug configuration bits 320 and the debug output bit 316 are assigned respective TDM bitslot(s) in the SoundWire frame shape 137 of the SoundWire frame 136, the slave de-multiplexer 324 and the slave multiplexer 328 can perform de-multiplexing and multiplexing automatically in the SoundWire data input signal 308 and the SoundWire data output signal 310, respectively.

In a non-limiting example, the slave TAP 232(1) is a slave JTAG TAP 232(1). In this regard, the SoundWire slave circuit 202(1) is configured to perform embedded JTAG debugging without adding the external debug pins required in the JTAG embedded test configuration 100 of FIG. 1A. In this regard, the debug configuration bits 320 received in the SoundWire data input signal 308 are JTAG-specific debug configuration bits. Likewise, the debug output bit 316 transmitted in the SoundWire data output signal 310 is a JTAG-specific debug output bit. Specifically, the SoundWire data input signal 308 includes a ClkValid bit 330, a TMS bit 332, and a TDI bit 334. The ClkValid bit 330, the TMS bit 332, and the TDI bit 334 are respectively received in an assigned ClkVaid bitslot(s), an assigned TMS bitslot(s), and an assigned TDI bitslot(s) in the SoundWire frame 136 in the SoundWire data input signal 308. The SoundWire data output signal 310 includes a TDO bit 336. The TDO bit 336 is transmitted in an assigned TDO bitslot(s) in the Sound-Wire frame 136 in the SoundWire data output signal 310.

Figure 5:
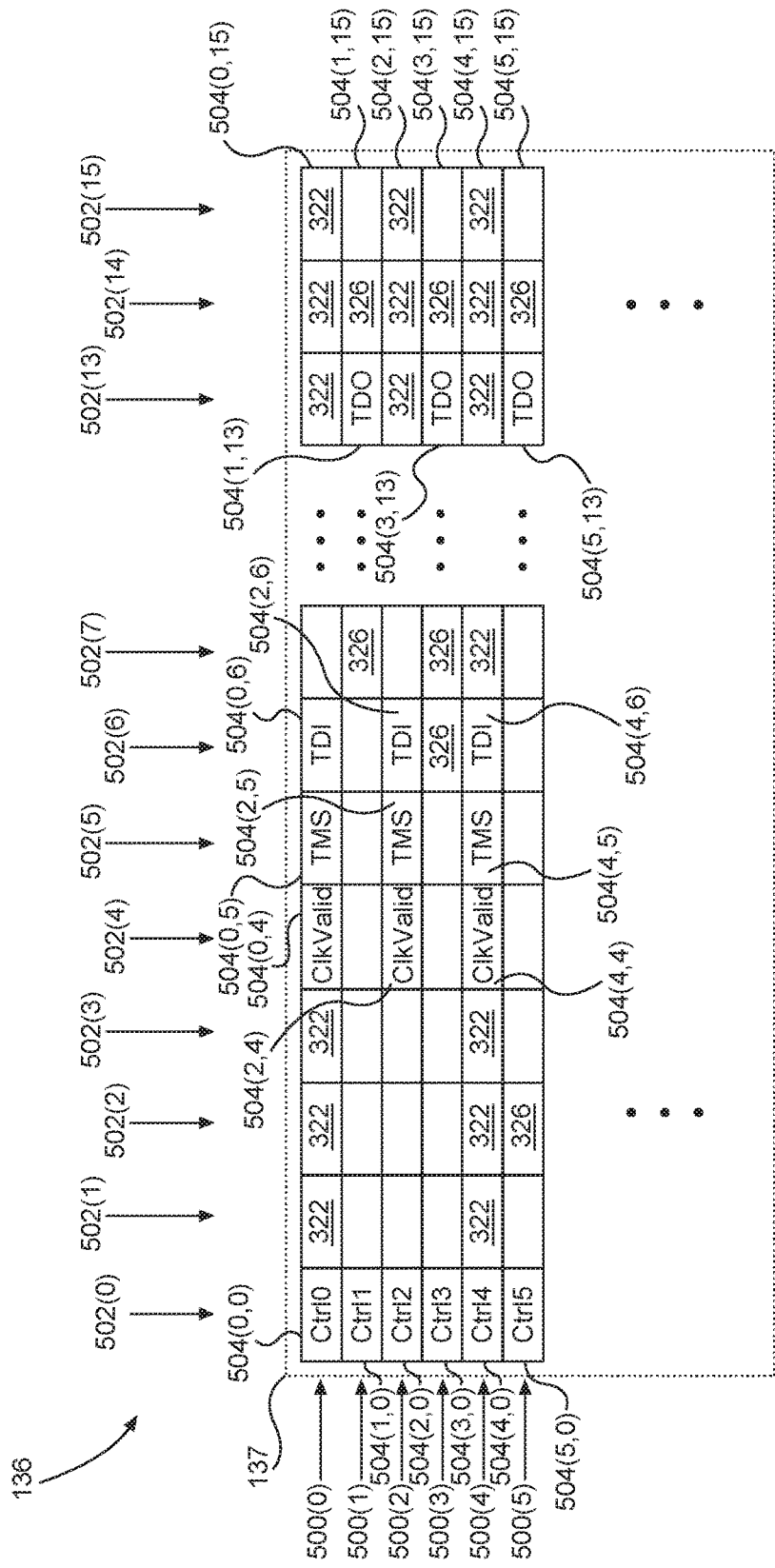
FIG. 5 is a schematic diagram providing an exemplary illustration of the SoundWire frame of FIG. 1C configured to communicate JTAG-specific debug input and output bits in respective assigned bitslots.

To help understand how the ClkValid bit 330, the TMS bit 332, the TDI bit 334, and the TDO bit 336 are respectively communicated in the assigned ClkValid bitslot(s), the TMS bitslot(s), the TDI bitslot(s), and the TDO bitslot(s) in the SoundWire frame shape 137 of the SoundWire frame 136, FIG. 5 is discussed next. In this regard, FIG. 5 is a schematic diagram providing an exemplary illustration of the Sound-Wire frame shape 137 in the SoundWire frame 136 of FIG. 1C configured to communicate the ClkValid bit 330, the TMS bit 332, the TDI bit 334, and the TDO bit 336 in respective assigned bitslots. Common elements between FIGS. 1C, 3, and 5 are shown therein with common element numbers and will not be re-described herein. For the convenience of illustration, the SoundWire frame shape 137 discussed herein includes first six (6) rows and sixteen (16) columns in each of the first six (6) rows. It shall be appreciated that the SoundWire frame shape 137 can be constructed with any number of rows and columns as permitted by the SoundWire Specification. According to the SoundWire Specification, the SoundWire frame 136 can carry multiple data streams (possibly running at different data rates) corresponding to multiple data channels associated with multiple SoundWire ports. In this regard, each of the multiple data channels can be configured to carry one or more of the debug input bits 315 and the debug output bit 316.

With reference to FIG. 5, the first six (6) rows of the SoundWire frame shape 137 are labeled as rows 500(0)-500(5). Each of the rows 500(1)-500(5) includes columns 502(0)-502(15). Accordingly, the first six (6) rows of the Sound-Wire frame shape 137 includes a plurality of bitslots 504(0,0)-504(5,15). In a non-limiting example, the ClkValid bit 330 is located in assigned ClkValid bitslots 504(0,4), 504(2,4), 504(4,4). The TMS bit 332 is located in assigned TMS bitslots 504(0,5), 504(2,5), 504(4,5). The TDI bit 334 is located in assigned TDI bitslots 504(0,6), 504(2,6), 504(4,6). The TDO bit 336 is located in assigned TDO bitslots 504(1,13), 504(3,13), 504(5,13). In this regard, the ClkValid bit 330, the TMS bit 332, the TDI bit 334, and the TDO bit 336 occupy twelve (12) bitslots among the first six (6) rows of the SoundWire frame shape 137. As such, the ClkValid bit 330, the TMS bit 332, the TDI bit 334, and the TDO bit 336 occupy twenty-five percent (25%) throughput of the Sound-Wire frame shape 137.

The SoundWire bus 212 (not shown) will be switched between communicating the SoundWire data input signal 308 and the SoundWire data output signal 310 based on TDM. In this regard, in a non-limiting example, the bitslots 504(0,0)-504(0,15), the bitslots 504(2,0)-504(2,15), and the bitslots 504(4,0)-504(4,15) are configured to be communicated in the SoundWire data input signal 308 (not shown). Accordingly, the bitslots 504(1,0)-504(1,15), the bitslots 504(3,0)-504(3,15), and the bitslots 504(5,0)-504(5,15) are configured to be communicated in the SoundWire data output signal 310 (not shown). As such, the slave debug circuitry 230(1) (not shown) can receive the ClkValid bit 330, the TMS bit 332, and the TDI bit 334 in the SoundWire data input signal 308, and transmit the TDO bit 336 in the SoundWire data output signal 310. In a non-limiting example, the assigned TDO bitslots 504(1,13), 504(3,13), 504(5,13) are adequately separated from the assigned TDI bitslots 504(0,6), 504(2,6), 504(4,6), respectively, to provide adequate switching time between receiving the SoundWire data input signal 308 and transmitting the SoundWire data output signal 310.

As previously discussed, the SoundWire frame 136 received in SoundWire data input signal 308 may include the audio input data bits 322. Likewise, the SoundWire frame 136 transmitted in the SoundWire data output signal 310 may include the audio output data bits 326. Accordingly, the audio input data bits 322 and the audio output data bits 326 are conveyed in the SoundWire frame 136 as well. As such, the ClkValid bit 330, the TMS bit 332, the TDI bit 334, and the TDO bit 336 shall not be assigned to bitslots configured to carry the audio input data bits 322 or the audio output data bits 326.

With reference back to FIG. 3, the slave debug circuitry 230(1) receives the SoundWire data input signal 308 that includes the ClkValid bit 330, the TMS bit 332, and the TDI bit 334. The slave debug controller 318 configures the slave de-multiplexer 324 to de-multiplex the SoundWire data input signal 308 to retrieve the ClkValid bit 330, the TMS bit 332, and the TDI bit 334. If the SoundWire data input signal 308 includes the audio input data bits 322, the slave debug controller 318 further configures the slave de-multiplexer 324 to de-multiplex the SoundWire data input signal 308 to separate the ClkValid bit 330, the TMS bit 332, and the TDI bit 334 from the audio input data bits 322.

The debug peripheral 312 is configured to operate based on the TMS bit 332, the TDI bit 334, and a TCK bit 338. As such, the slave debug circuitry 230(1) is further configured to construct the TCK bit 338 based on the ClkValid bit 330. Specifically, the slave debug circuitry 230(1) toggles the TCK bit 338 when the ClkValid bit 330 is a logical HIGH, and maintains the TCK bit 338 when the ClkValid bit 330 is a logical LOW. To help illustrate clock construction performed by the slave debug circuitry 230(1), FIG. 6 is discussed next.

Figure 6:
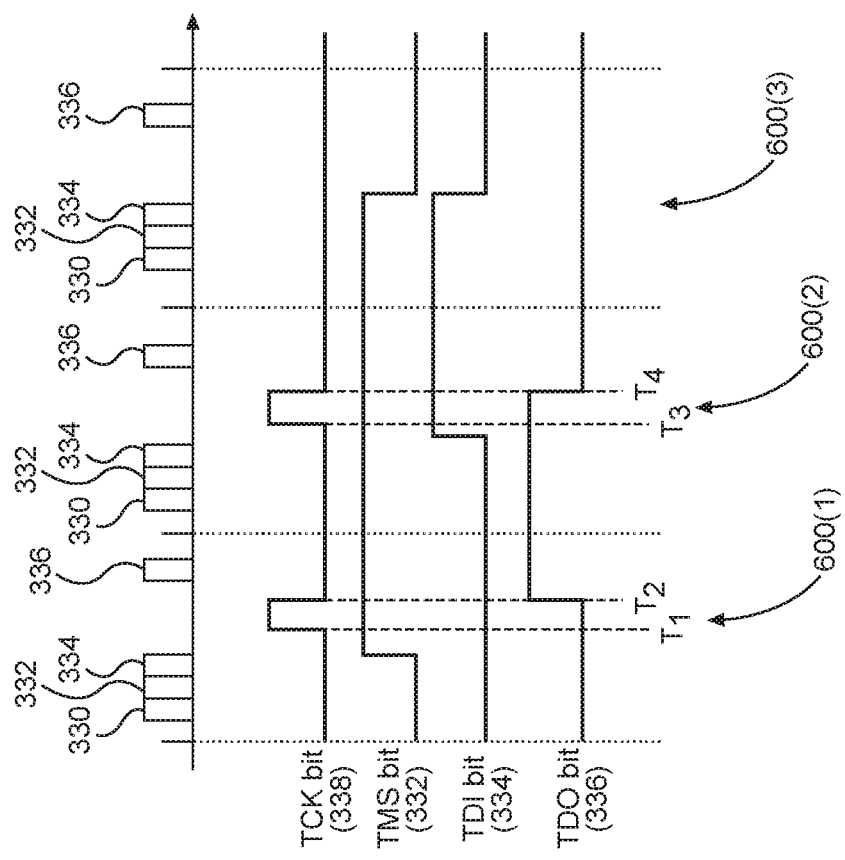
FIG. 6 is a schematic diagram providing an exemplary illustration of constructing a test clock (TCK) bit based on a clock valid (ClkValid) bit for performing JTAG-based embedded debugging.

In this regard, FIG. 6 is a schematic diagram providing an exemplary illustration of constructing the TCK bit 338 based on the ClkValid bit 330 for performing JTAG-based embedded debugging. Common elements between FIGS. 3, 5, and 6 are shown therein with common element numbers and will not be re-described herein.

With reference to FIG. 6, three (3) sample intervals 600(1)-600(3) are illustrated. In a non-limiting example, the sample interval 600(1) includes the bitslots 504(0,0)-504(1,15) of FIG. 5. As such, the ClkValid bit 330, the TMS bit 332, the TDI bit 334, and the TDO bit 336 are located in the bitslot 504(0,4), the bitslot 504(0,5), the bitslot 504(0,6), and the bitslot 504(1,13) of FIG. 5, respectively. The sample interval 600(2) includes the bitslots 504(2,0)-504(3,15) of FIG. 5. As such, the ClkValid bit 330, the TMS bit 332, the TDI bit 334, and the TDO bit 336 are located in the bitslot 504(2,4), the bitslot 504(2,5), the bitslot 504(2,6), and the bitslot 504(3,13) of FIG. 5, respectively. The sample interval 600(3) includes the bitslots 504(4,0)-504(5,15) of FIG. 5. As such, the ClkValid bit 330, the TMS bit 332, the TDI bit 334, and the TDO bit 336 are located in the bitslot 504(4,4), the bitslot 504(4,5), the bitslot 504(4,6), and the bitslot 504(5, 13) of FIG. 5, respectively.

Continuing with the above non-limiting example, the ClkValid bit 330 represents a logical HIGH in the sample interval 600(1). Accordingly, the TCK bit 338 is toggled from logical LOW to logical HIGH at time $T_1$. At time $T_2$, the TCK bit 338 returns to logical LOW, thus allowing the TDO bit 336 to be communicated. In the sample interval 600(2), the ClkValid bit 330 again represents a logical HIGH. As a result, the TCK bit 338 is toggled again at time $T_3$ and returns to logical LOW at time $T_4$, thus allowing the TDO bit 336 to be communicated. In the sample interval 600(3), the ClkValid bit 330 represents a logical LOW. Consequently, the TCK bit 338 remains as logical LOW.

With reference back to FIG. 3, the slave JTAG TAP 232(1) includes a slave TCK pin 340, a slave TMS pin 342, a slave TDI pin 344, and a slave TDO pin 346. It shall be noted that the slave TCK pin 340, the slave TMS pin 342, the slave TDI pin 344, and the slave TDO pin 346 are internal to the SoundWire slave circuit 202(1), rather than being exposed externally. In a non-limiting example, the slave TCK pin 340, the slave TMS pin 342, the slave TDI pin 344, and the slave TDO pin 346 are provided via internal wiring. The slave debug circuitry 230(1) is configured to provide the TCK bit 338, the TMS bit 332, and the TDI bit 334 to the slave TCK pin 340, the slave TMS pin 342, and the slave TDI pin 344 in the slave JTAG TAP 232(1), respectively.

The slave debug controller 318 receives the TDO bit 336 from the slave JTAG TAP 232(1) via the slave TDO pin 346. Thus, the slave debug controller 318 can generate the SoundWire data output signal 310 that includes the TDO bit 336 in the assigned debug output bitslot. The slave debug controller 318 may configure the slave multiplexer 328 to multiplex the TDO bit 336 with the audio output data bits 326 to generate the SoundWire data output signal 310.

As previously discussed in FIG. 2, the SoundWire master circuit 204 includes the master TAP 222 for interfacing with the host PC 206. The SoundWire master circuit 204 also includes the master SoundWire circuitry 224 for communicating the bidirectional data signals 218(1)-218(N) over the SoundWire bus 212. The SoundWire master circuit 204 also includes the master debug circuitry 226 configured to multiplex the debug configuration parameters 208 into the assigned debug configuration slot(s) in the SoundWire frame 136. Additional aspects of the SoundWire master circuit 204 are further discussed next with reference to FIG. 7.

Figure 7:
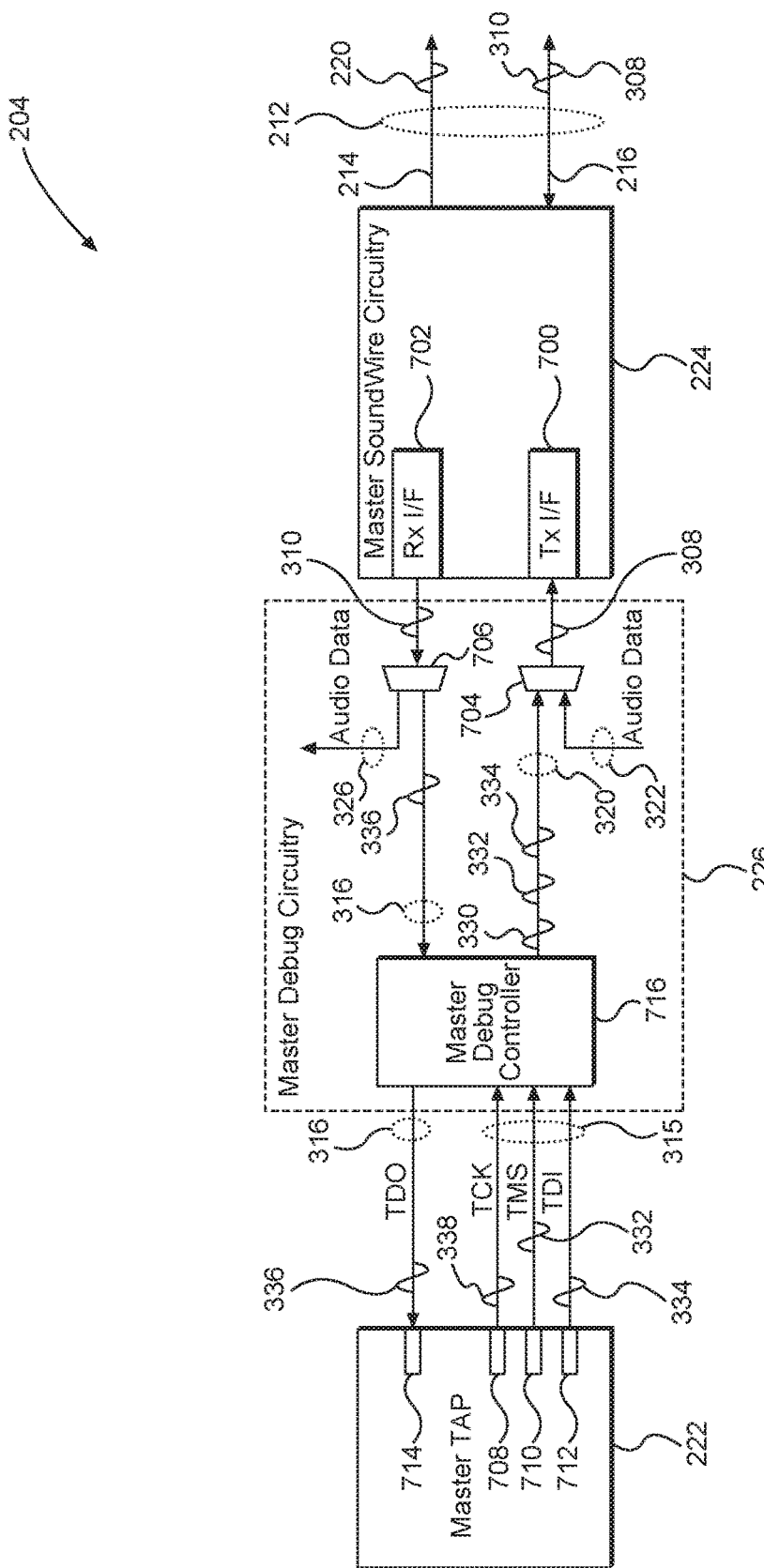
FIG. 7 is a schematic diagram providing an exemplary illustration of a SoundWire master circuit configured to enable SoundWire-based embedded debugging in the SoundWire slave circuits of FIG. 2.

In this regard, FIG. 7 is a schematic diagram providing an exemplary illustration of the SoundWire master circuit 204 of FIG. 2 configured to enable SoundWire-based embedded debugging in the SoundWire slave circuits 202(1)-202(N). Common elements between FIGS. 1C, 2, 3, and 7 are shown therein with common element numbers and will not be re-described herein.

With reference to FIG. 7, the master SoundWire circuitry 224 includes a master transmit interface 700 (abbreviated as Tx I/F in FIG. 7) and a master receive interface 702 (abbreviated as Rx I/F in FIG. 7). The master SoundWire circuitry 224 is configured receive the SoundWire data input signal 308 from the master transmit interface 700, and transmit the SoundWire data input signal 308 to the Sound-Wire slave circuit 202(1) (not shown) over the SoundWire bus 212. The master SoundWire circuitry 224 is also configured to receive the SoundWire data output signal 310 from the SoundWire slave circuit 202(1) over the SoundWire bus 212 and provide the SoundWire data output signal 310 to the master receive interface 702.

The master debug circuitry 226 is configured to receive the debug input bits 315 from the master TAP 222, and generate the debug configuration bits 320 based on the debug input bits 315. The master debug circuitry 226 then generates the SoundWire data input signal 308 that includes the debug configuration bits 320 in the assigned debug configuration bitslots. The master debug circuitry 226 subsequently provides the SoundWire data input signal 308 to the master transmit interface 700. The master debug circuitry 226 receives the SoundWire data output signal 310 that includes the debug output bit 316 in the assigned debug output bitslot from the master receive interface 702. The master debug circuitry 226 then retrieves the debug output bit 316 from the SoundWire data output signal 310 and provides the debug output bit 316 to the master TAP 222. The master debug circuitry 226 includes a master multiplexer 704 and a master de-multiplexer 706. The master multiplexer 704 can be configured to generate the Sound-Wire data input signal 308 by multiplexing the debug configuration bits 320 with the audio input data bits 322. The master de-multiplexer 706 can be configured to de-multiplex the SoundWire data output signal 310 to separate the debug output bit 316 from the audio output data bits 326.

In a non-limiting example, the master TAP 222 is a master JTAG TAP 222. In this regard, the master JTAG TAP 222 includes a master TCK pin 708, a master TMS pin 710, a master TDI pin 712, and a master TDO pin 714. It shall be noted that the master TCK pin 708, the master TMS pin 710, the master TDI pin 712, and the master TDO pin 714 are internal to the SoundWire master circuit 204, rather than being exposed externally. In a non-limiting example, the master TCK pin 708, the master TMS pin 710, the master TDI pin 712, and the master TDO pin 714 are provided via internal wiring. In another non-limiting example, the master JTAG TAP 222 can also be configured to expose dedicated debug pins, such as the TCK pin 104, the TMS pin 106, the TDI pin 108, and the TDO pin 110 of FIG. 1A (not shown) for interfacing with the host PC 206 of FIG. 2 (not shown). The master debug circuitry 226 is configured to receive the TCK bit 338, the TMS bit 332, and the TDI bit 334 from the master TCK pin 708, the master TMS pin 710, and the master TDI pin 712, respectively, in the master JTAG TAP 222. The master debug circuitry 226 includes a master debug controller 716. The master debug controller 716 is configured to convert the TCK bit 338 into the ClkValid bit 330. The master debug controller 716 subsequently generates the SoundWire data input signal 308 that includes the ClkValid bit 330 in the assigned ClkValid bitslot, the TMS bit 332 in the assigned TMS bitslot, and the TDI bit 334 in the assigned TDI bitslot. In a non-limiting example, the master debug controller 716 configures the master multiplexer 704 to generate the SoundWire data input signal 308 by multiplexing the ClkValid bit 330, the TMS bit 332, and the TDI bit 334 with the audio input data bits 322.

The master debug controller 716 receives the SoundWire data output signal 310 including the TDO bit 336 in the assigned debug output bitslot, and provides the TDO bit 336 to the master TDO pin 714 in the master JTAG TAP 222. The master debug controller 716 may configure the master de-multiplexer 706 to de-multiplex the SoundWire data output signal 310 to separate the TDO bit 336 from the audio output data bits 326.

With reference back to FIG. 2, the data line 216 is configured to carry the bidirectional data signals 218(1)-218(N) between the SoundWire master circuit 204 and the SoundWire slave circuits 202(1)-202(N) using the SoundWire frame 136. In this regard, the SoundWire frame 136 communicated over the data line 216 can contain audio data bits associated with the SoundWire slave circuits 202(1)-202(N). The amount of bitslots in the SoundWire frame 136 that are occupied by the audio data bits depends on the type of audio application the SoundWire master circuit 204 is supporting. For example, the amount of bitslots required in the SoundWire frame 136 for carrying the audio data bits will be less if the audio application is a mono-audio application. In contrast, the amount of bitslots required in the SoundWire frame 136 for carrying the audio data bits will be higher if the audio application supported by the SoundWire master circuit 204 is a seven-to-one (7:1) surround sound application. As such, the SoundWire master circuit 204 needs take into consideration the bandwidth required for carrying audio data bits when determining the assigned debug configuration bitslots and the assigned debug output bitslot(s) in the SoundWire frame 136.

Figure 8:
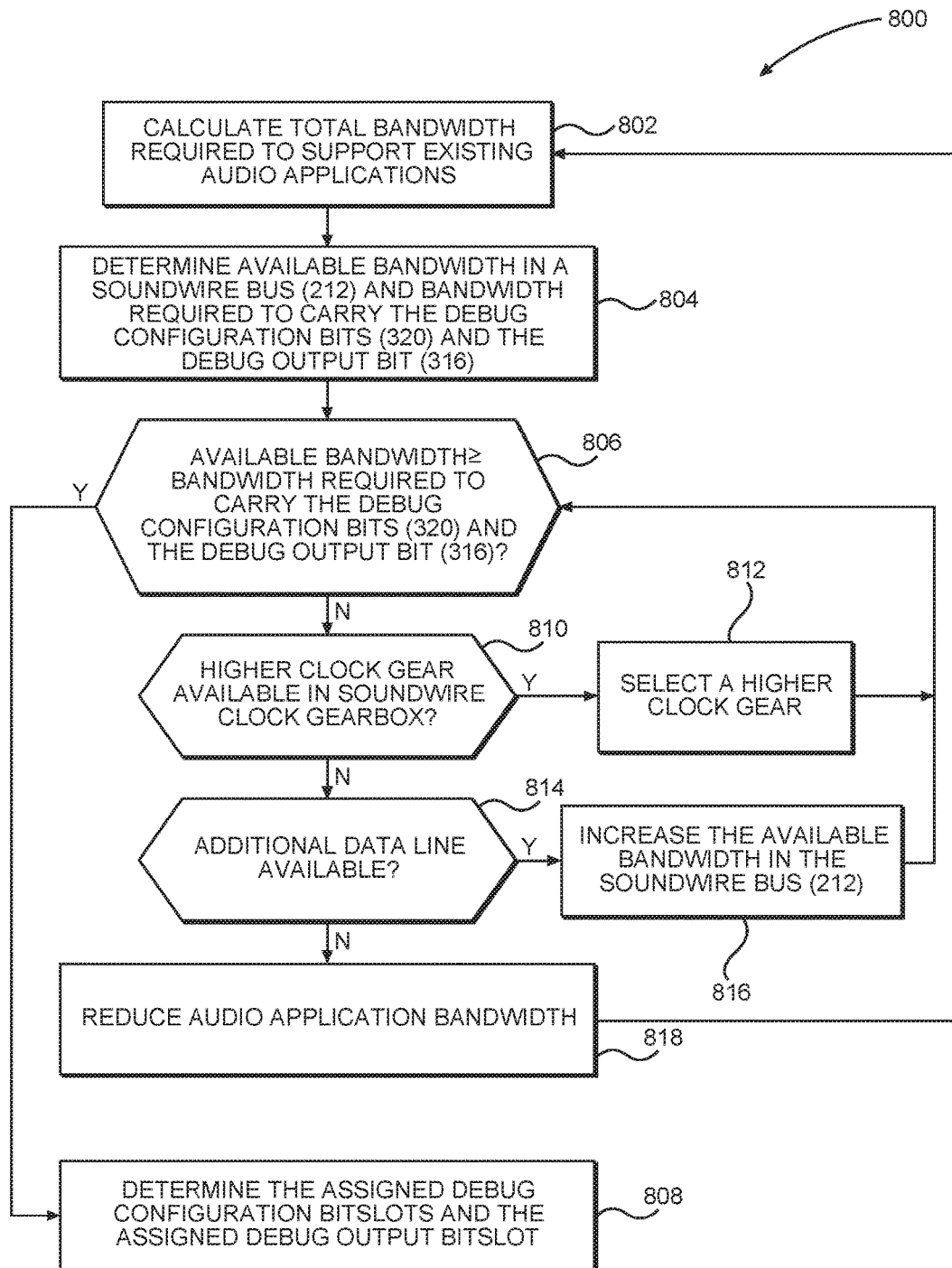
FIG. 8 is a flowchart of an exemplary process that may be employed by a SoundWire master circuit to determine the available bandwidth in a SoundWire bus for performing SoundWire-based embedded debugging on the SoundWire slave circuits of FIG. 2.

In this regard, FIG. 8 is a flowchart of an exemplary process 800 that may be employed by the SoundWire master circuit 204 of FIG. 2 to determine the available bandwidth in the SoundWire bus 212 for performing SoundWire-based embedded debugging on the SoundWire slave circuits 202(1)-202(N). In a non-limiting example, the process 800 is employed by the master debug controller 716 of FIG. 7 to determine the available bandwidth in the SoundWire bus 212 for communicating the ClkValid bit 330 in the assigned ClkValid bitslot, the TMS bit 332 in the assigned TMS bitslot, the TDI bit 334 in the assigned TDI bitslot, and the TDO bit 336 in the assigned TDO bitslot of the SoundWire frame 136.

With reference to FIG. 8, the SoundWire master circuit 204 first calculates the total bandwidth required to support an existing audio application (hereinafter referred to as "audio bandwidth") (block 802). The existing audio application may include mono-audio application, two-channel stereo audio application, five-to-one (5:1) surround sound audio application, and 7:1 surround sound audio application. The SoundWire master circuit 204 then determines the available bandwidth in the SoundWire bus 212 (hereinafter referred to as "available bandwidth") and the bandwidth required to carry the debug configuration bits 320 and the debug output bit 316 (hereinafter referred to as "debug bandwidth") (block 804). The SoundWire master circuit 204 determines the available bandwidth by subtracting the audio bandwidth from a total bandwidth of the SoundWire bus 212. In a non-limiting example, the total bandwidth of the SoundWire bus 212 can be determined based on a SoundWire frame rate of the SoundWire bus 212 and the rows and columns included in the SoundWire frame shape 137. The frame rate of the SoundWire bus 212 can be determined based on a SoundWire clock frequency, which may be nine thousand six hundred kilohertz (9600 KHz) or twelve thousand two hundred eighty-eight kilohertz (12288 KHz). In a non-limiting example, the SoundWire frame rate is twelve thousand five hundred frames per second (12500 fps) when the SoundWire clock frequency is 9600 KHz. In another non-limiting example, the SoundWire frame rate is sixteen thousand frames per second (16000 fps) when the SoundWire clock frequency is 12288 KHz. Accordingly, the bandwidth of the SoundWire bus 212 can be determined based on the equations (Eq. 1 and Eq. 2) below.

$$\text{Bandwidth} = (\text{SoundWire frame rate}) \times (R) \times (C-1) \quad \text{(Eq. 1)}$$

$$\text{Bandwidth} = (\text{SoundWire clock frequency})(C-1)/C \quad \text{(Eq. 2)}$$

In the equations above, R represents the number of rows in the SoundWire frame shape 137. C represents the number of columns in the SoundWire frame shape 137.

The SoundWire master circuit 204 then determines whether the available bandwidth is greater than or equal to the debug bandwidth (block 806). If the available bandwidth is greater than or equal to the debug bandwidth, the SoundWire master circuit 204 proceeds to determining the assigned debug configuration bitslots and the assigned debug output bitslot in the SoundWire frame 136 (block 808). If the available bandwidth is less than the debug bandwidth, the SoundWire master circuit 204 further determines whether a higher clock gear is available in a SoundWire clock gearbox (block 810). If the higher clock gear is available, the SoundWire master circuit 204 selects a higher clock gear from the SoundWire clock gearbox (block 812). In a non-limiting example, the SoundWire master circuit 204 switches the clock signal 220 to a higher clock frequency associated with the higher clock gear. If the higher clock gear is unavailable, the SoundWire master circuit 204 then determines whether an additional data line is available in the SoundWire bus 212 (block 814). As previously stated in FIGS. 1B and 2, the SoundWire Specification allows the SoundWire bus 212 to include optionally additional data lines. As such, the SoundWire master circuit 204 determines whether such additional data lines exist in the SoundWire bus 212. If the additional data line is available in the SoundWire bus 212, the SoundWire master circuit 204 increases the available bandwidth in the SoundWire bus 212 (block 816). In this regard, the SoundWire master circuit 204 adds the bandwidth associated with the additional data line to the available bandwidth. If the additional data line is not available, the SoundWire master circuit 204 may reduce the audio bandwidth occupied by the audio applications (block 818). In a non-limiting example, the SoundWire master circuit 204 may degrade a 7:1 surround sound audio application to a 5:1 surround sound audio application, or further to a two-channel stereo audio application, thus increasing the available bandwidth.

SoundWire-based embedded debugging according to aspects disclosed herein may be provided in or integrated into any processor-based device, such as the electronic device 200 of FIG. 2. Examples, without limitation, include a set top box, an entertainment unit, a navigation device, a communications device, a fixed location data unit, a mobile location data unit, a mobile phone, a cellular phone, a smart phone, a tablet, a phablet, a computer, a portable computer, a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, a portable digital video player, and an automobile.

Figure 9:
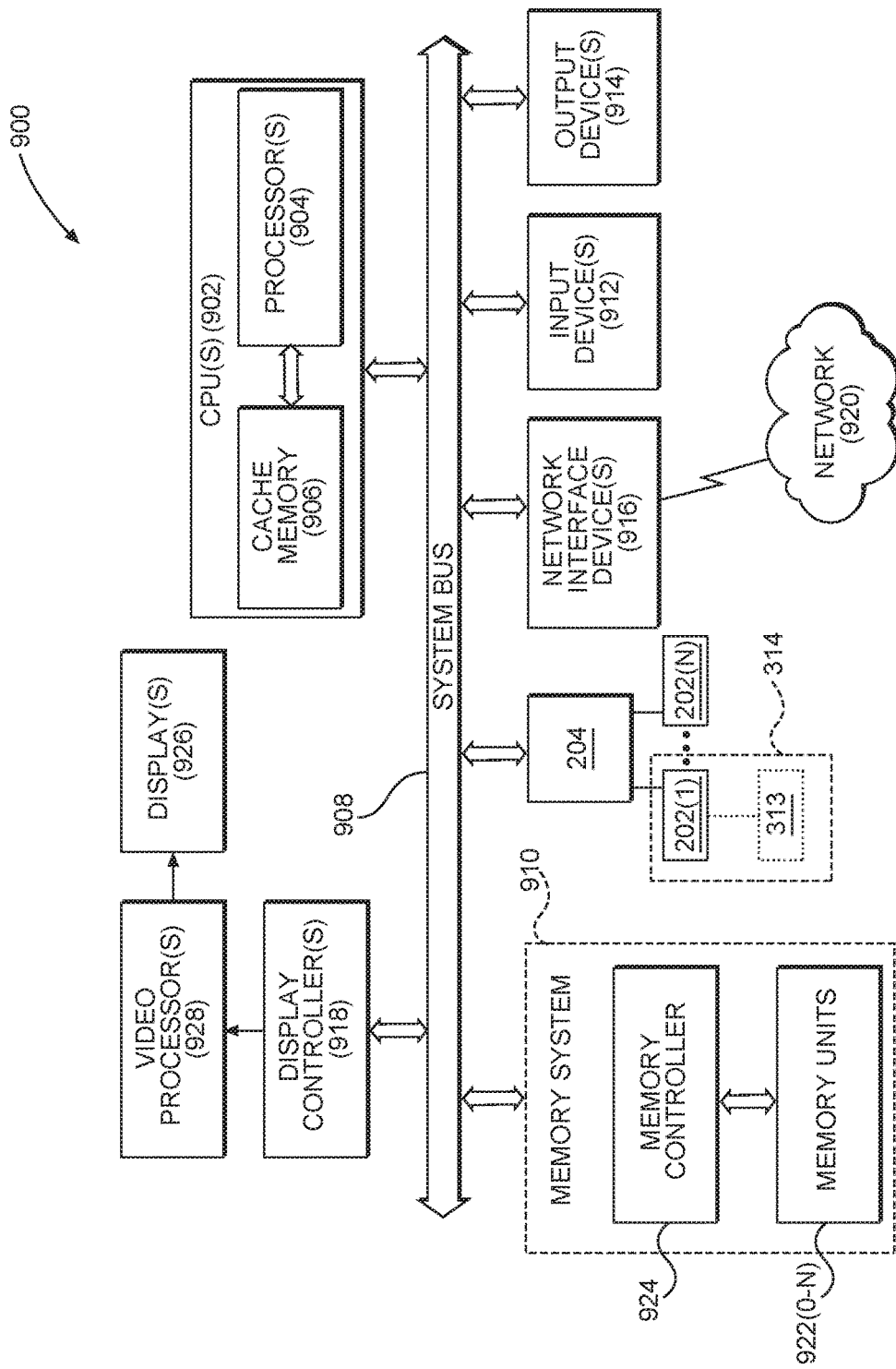
FIG. 9 illustrates an example of a processor-based system that can support the electronic device of FIG. 2.

In this regard, FIG. 9 illustrates an example of a processor-based system 900 that can support the SoundWire master circuit 204 and the SoundWire slave circuits 202(1)-202(N) in the electronic device 200 of FIG. 2. In this example, the processor-based system 900 includes one or more central processing units (CPUs) 902, each including one or more processors 904. The CPU(s) 902 may have cache memory 906 coupled to the processor(s) 904 for rapid access to temporarily stored data. The CPU(s) 902 is coupled to a system bus 908. As is well known, the CPU(s) 902 communicates with other devices by exchanging address, control, and data information over the system bus 908. Although not illustrated in FIG. 9, multiple system buses 908 could be provided, wherein each system bus 908 constitutes a different fabric.

Other master and slave devices can be connected to the system bus 908. As illustrated in FIG. 9, these devices can include a memory system 910, one or more input devices 912, one or more output devices 914, one or more network interface devices 916, and one or more display controllers 918, as examples. The input device(s) 912 can include any type of input device, including, but not limited to, input keys, switches, voice processors, etc. The output device(s) 914 can include any type of output device, including, but not limited to, audio, video, other visual indicators, etc. The network interface device(s) 916 can be any device configured to allow exchange of data to and from a network 920. The network 920 can be any type of network, including, but not limited to, a wired network, a private or public network, a local area network (LAN), a wide area network (WAN), or the Internet. The network interface device(s) 916 can be configured to support any type of communications protocol desired. The memory system 910 can include one or more memory units 922(0-N) and a memory controller 924.

The CPU(s) 902 may also be configured to access the display controller(s) 918 over the system bus 908 to control information sent to one or more displays 926. The display controller(s) 918 sends information to the display(s) 926 to be displayed via one or more video processors 928, which process the information to be displayed into a format suitable for the display(s) 926. The display(s) 926 can include any type of display, including, but not limited to, a cathode ray tube (CRT), a liquid crystal display (LCD), a plasma display, a light emitting diode (LED) display, etc.

Those of skill in the art will further appreciate that the various illustrative logical blocks, modules, circuits, and algorithms described in connection with the aspects disclosed herein may be implemented as electronic hardware, instructions stored in memory or in another computer readable medium and executed by a processor or other processing device, or combinations of both. The master devices and slave devices described herein may be employed in any circuit, hardware component, integrated circuit (IC), or IC chip, as examples. Memory disclosed herein may be any type and size of memory and may be configured to store any type of information desired. To illustrate clearly this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented or performed with a processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices (e.g., a combination of a DSP and a microprocessor, a plurality of microprocessors, one or more microprocessors in conjunction with a DSP core, or any other such configuration).

The aspects disclosed herein may be embodied in hardware and in instructions that are stored in hardware, and may reside, for example, in Random Access Memory (RAM), flash memory, Read Only Memory (ROM), Electrically Programmable ROM (EPROM), Electrically Erasable Programmable ROM (EEPROM), registers, a hard disk, a removable disk, a CD-ROM, or any other form of computer readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary aspects herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flowchart diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein, but is to be accorded the widest scope consistent with the principles and novel features disclosed herein.

What is claimed is:

1. A SoundWire slave circuit in an electronic device, comprising:
   slave SoundWire circuitry comprising a slave receive interface and a slave transmit interface, the slave SoundWire circuitry configured to:
      receive a SoundWire data input signal over a SoundWire bus and provide the SoundWire data input signal to the slave receive interface; and
      receive a SoundWire data output signal from the slave transmit interface and transmit the SoundWire data output signal over the SoundWire bus; and slave debug circuitry configured to:
receive the SoundWire data input signal comprising a plurality of debug configuration bits in a plurality of assigned debug configuration bitslots from the slave receive interface;
generate a plurality of debug input bits based on the plurality of debug configuration bits in the plurality of assigned debug configuration bitslots; and
provide the SoundWire data output signal comprising a debug output bit in an assigned debug output bitslot to the slave transmit interface.

2. The SoundWire slave circuit of claim 1, further comprising a slave test access port (TAP), wherein the slave debug circuitry is further configured to provide the plurality of debug input bits to the slave TAP and receive the debug output bit from the slave TAP.

3. The SoundWire slave circuit of claim 1, wherein the slave debug circuitry is further configured to:
receive the SoundWire data input signal that further comprises a plurality of audio input data bits; and
de-multiplex the SoundWire data input signal to separate the plurality of debug configuration bits from the plurality of audio input data bits.

4. The SoundWire slave circuit of claim 1, wherein the slave debug circuitry is further configured to generate the SoundWire data output signal by multiplexing the debug output bit with a plurality of audio output data bits.

5. The SoundWire slave circuit of claim 1, further comprising a slave Joint Test Action Group (JTAG) test access port (TAP), the slave JTAG TAP comprising a slave test clock (TCK) pin, a slave test mode select (TMS) pin, a slave test data input (TDI) pin, and a slave test data output (TDO) pin.

6. The SoundWire slave circuit of claim 5, wherein the slave debug circuitry is further configured to:
receive the SoundWire data input signal further comprising a clock valid (ClkValid) bit in an assigned ClkValid bitslot, a TMS bit in an assigned TMS bitslot, and a TDI bit in an assigned TDI bitslot;
de-multiplex the SoundWire data input signal to retrieve the ClkValid bit, the TMS bit, and the TDI bit;
construct a TCK bit based on the ClkValid bit; and
provide the TCK bit, the TMS bit, and the TDI bit to the slave TCK pin, the slave TMS pin, and the slave TDI pin, respectively.

7. The SoundWire slave circuit of claim 6, wherein the slave debug circuitry is further configured to:
receive the SoundWire data input signal that further comprises a plurality of audio input data bits; and
de-multiplex the SoundWire data input signal to separate the ClkValid bit, the TMS bit, and the TDI bit from the plurality of audio input data bits.

8. The SoundWire slave circuit of claim 5, wherein the slave debug circuitry is further configured to receive a TDO bit via the slave TDO pin and generate the SoundWire data output signal comprising the TDO bit in the assigned debug output bitslot.

9. The SoundWire slave circuit of claim 8, wherein the slave debug circuitry is further configured to generate the SoundWire data output signal by multiplexing the TDO bit with a plurality of audio output data bits.

10. The SoundWire slave circuit of claim 1 integrated into an integrated circuit.

11. The SoundWire slave circuit of claim 1 integrated into a device selected from the group consisting of: a navigation device; a communications device; a mobile location data unit; a mobile phone; a cellular phone; a smart phone; a tablet; a phablet; a portable computer; a desktop computer; a personal digital assistant (PDA); a monitor; a computer monitor; a television; a tuner; a radio; a satellite radio; a music player; a digital music player; a portable music player; a digital video player; a video player; a digital video disc (DVD) player; a portable digital video player; and an automobile.

12. A SoundWire slave circuit in an electronic device, comprising:
a means for providing SoundWire communication comprising a slave receive interface and a slave transmit interface, the means for providing SoundWire communication configured to:
receive a SoundWire data input signal over a SoundWire bus and provide the SoundWire data input signal to the slave receive interface; and
receive a SoundWire data output signal from the slave transmit interface and transmit the SoundWire data output signal over the SoundWire bus; and
a means for debugging the SoundWire slave circuit configured to:
receive the SoundWire data input signal comprising a plurality of debug configuration bits in a plurality of assigned debug configuration bitslots from the slave receive interface;
generate a plurality of debug input bits based on the plurality of debug configuration bits in the plurality of assigned debug configuration bitslots; and
provide the SoundWire data output signal comprising a debug output bit in an assigned debug output bitslot to the slave transmit interface.

13. A method for enabling SoundWire-based embedded debugging on a SoundWire slave circuit over a SoundWire bus, comprising:
receiving a SoundWire data input signal comprising a plurality of debug configuration bits in a plurality of assigned debug configuration bitslots at the SoundWire slave circuit over the SoundWire bus;
generating a plurality of debug input bits based on the plurality of debug configuration bits in the plurality of assigned debug configuration bitslots; and
transmitting a SoundWire data output signal comprising a debug output bit in an assigned debug output bitslot from the SoundWire slave circuit over the SoundWire bus.

14. The method of claim 13, further comprising providing the plurality of debug input bits to a slave test access port (TAP) and receiving the debug output bit from the slave TAP.

15. The method of claim 13, further comprising:
receiving the SoundWire data input signal that further comprises a plurality of audio input data bits; and
de-multiplexing the SoundWire data input signal to separate the plurality of debug configuration bits from the plurality of audio input data bits.

16. The method of claim 13, further comprising generating the SoundWire data output signal by multiplexing the debug output bit with a plurality of audio output data bits.

17. The method of claim 13, further comprising:
receiving the SoundWire data input signal further comprising a clock valid (ClkValid) bit in an assigned ClkValid bitslot, a test mode select (TMS) bit in an assigned TMS bitslot, and a test data input (TDI) bit in an assigned TDI bitslot over the SoundWire bus;
de-multiplexing the SoundWire data input signal to retrieve the ClkValid bit, the TMS bit, and the TDI bit;

constructing a test clock (TCK) bit based on the ClkValid bit; and providing the TCK bit, the TMS bit, and the TDI bit to a slave TCK pin, a slave TMS pin, and a slave TDI pin, respectively, in a slave Joint Test Action Group (JTAG) test access port (TAP).

18. The method of claim 17, further comprising:

receiving the SoundWire data input signal that further comprises a plurality of audio input data bits; and de-multiplexing the SoundWire data input signal to separate the ClkValid bit, the TMS bit, and the TDI bit from the plurality of audio input data bits.

19. The method of claim 13, further comprising receiving a test data output (TDO) bit via a slave TDO pin in a slave Joint Test Action Group (JTAG) test access port (TAP) and generating the SoundWire data output signal comprising the TDO bit in the assigned debug output bitslot.

20. The method of claim 19, further comprising generating the SoundWire data output signal by multiplexing the TDO bit with a plurality of audio output data bits.

21. A SoundWire master circuit in an electronic device, comprising:

master SoundWire circuitry comprising a master receive interface and a master transmit interface, the master SoundWire circuitry configured to:

receive a SoundWire data input signal from the master transmit interface and transmit the SoundWire data input signal over a SoundWire bus; and receive a SoundWire data output signal over the SoundWire bus and provide the SoundWire data output signal to the master receive interface; and master debug circuitry configured to:

receive a plurality of debug input bits and generate a plurality of debug configuration bits based on the plurality of debug input bits;

generate the SoundWire data input signal comprising the plurality of debug configuration bits in a plurality of assigned debug configuration bitslots;

provide the SoundWire data input signal to the master transmit interface;

receive the SoundWire data output signal comprising a debug output bit in an assigned debug output bitslot from the master receive interface; and retrieve the debug output bit from the SoundWire data output signal.

22. The SoundWire master circuit of claim 21, further comprising a master test access port (TAP), wherein the master debug circuitry is further configured to receive the plurality of debug input bits from the master TAP and provide the debug output bit to the master TAP.

23. The SoundWire master circuit of claim 21, wherein the master debug circuitry is further configured to generate the SoundWire data input signal by multiplexing the plurality of debug configuration bits with a plurality of audio input data bits.

24. The SoundWire master circuit of claim 21, wherein the master debug circuitry is further configured to:

receive the SoundWire data output signal that further comprises a plurality of audio output data bits; and de-multiplex the SoundWire data output signal to separate the debug output bit from the plurality of audio output data bits.

25. The SoundWire master circuit of claim 21, further comprising a master Joint Test Action Group (JTAG) test access port (TAP), the master JTAG TAP comprising a master test clock (TCK) pin, a master test mode select (TMS) pin, a master test data input (TDI) pin, and a master test data output (TDO) pin.

26. The SoundWire master circuit of claim 25, wherein the master debug circuitry is further configured to:

receive a TCK bit, a TMS bit, and a TDI bit from the master TCK pin, the master TMS pin, and the master TDI pin, respectively;

convert the TCK bit into a clock valid (ClkValid) bit; and generate the SoundWire data input signal comprising the ClkValid bit in an assigned ClkValid bitslot, the TMS bit in an assigned TMS bitslot, and the TDI bit in an assigned TDI bitslot.

27. The SoundWire master circuit of claim 26, wherein the master debug circuitry is further configured to generate the SoundWire data input signal by multiplexing the ClkValid bit, the TMS bit, and the TDI bit with a plurality of audio input data bits.

28. The SoundWire master circuit of claim 25, wherein the master debug circuitry is further configured to:

receive the SoundWire data output signal comprising a TDO bit in the assigned debug output bitslot; and provide the TDO bit to the master TDO pin.

29. The SoundWire master circuit of claim 28, wherein the master debug circuitry is further configured to de-multiplex the SoundWire data output signal to separate the TDO bit from a plurality of audio output data bits.

30. A method for exchanging debug information with a SoundWire master circuit over a SoundWire bus, comprising:

receiving a plurality of debug input bits and generating a plurality of debug configuration bits based on the plurality of debug input bits;

generating a SoundWire data input signal comprising the plurality of debug configuration bits in a plurality of assigned debug configuration bitslots over the SoundWire bus;

receiving a SoundWire data output signal comprising a debug output bit in an assigned debug output bitslot over the SoundWire bus; and retrieving the debug output bit from the SoundWire data output signal.

31. The method of claim 30, further comprising receiving the plurality of debug configuration bits from a master test access port (TAP) and providing the debug output bit to the master TAP.

32. The method of claim 30, further comprising generating the SoundWire data input signal by multiplexing the plurality of debug configuration bits with a plurality of audio input data bits.

33. The method of claim 30, further comprising:

receiving the SoundWire data output signal that further comprises a plurality of audio output data bits; and de-multiplexing the SoundWire data output signal to separate the debug output bit from the plurality of audio output data bits.

34. The method of claim 30, further comprising:

receiving a test clock (TCK) bit, a test mode select (TMS) bit, and a test data input (TDI) bit from a master TCK pin, a master TMS pin, and a master TDI pin, respectively, in a master Joint Test Action Group (JTAG) test access port (TAP);

converting the TCK bit into a clock valid (ClkValid) bit; and generating the SoundWire data input signal comprising the ClkValid bit in an assigned ClkValid bitslot, the TMS bit in an assigned TMS bitslot, and the TDI bit in an assigned TDI bitslot.

35. The method of claim 34, further comprising generating the SoundWire data input signal by multiplexing the ClkValid bit, the TMS bit, and the TDI bit with a plurality of audio input data bits.

36. The method of claim 30, further comprising:
receiving the SoundWire data output signal comprising a test data output (TDO) bit in an assigned TDO bitslot; and
providing the TDO bit to a master TDO pin in a master Joint Test Action Group (JTAG) test access port (TAP).

37. The method of claim 36, further comprising de-multiplexing the SoundWire data output signal to separate the TDO bit from a plurality of audio output data bits.

38. An electronic device, comprising:
a SoundWire master circuit, comprising:
master SoundWire circuitry comprising a master receive interface and a master transmit interface, the master SoundWire circuitry configured to:
receive a SoundWire data input signal from the master transmit interface and transmit the SoundWire data input signal over a SoundWire bus; and
receive a SoundWire data output signal over the SoundWire bus and provide the SoundWire data output signal to the master receive interface; and
master debug circuitry configured to:
receive a plurality of debug input bits and generate a plurality of debug configuration bits based on the plurality of debug input bits;
generate the SoundWire data input signal comprising the plurality of debug configuration bits in a plurality of assigned debug configuration bitslots;
provide the SoundWire data input signal to the master transmit interface;
receive the SoundWire data output signal comprising a debug output bit in an assigned debug output bitslot from the master receive interface; and
retrieve the debug output bit from the SoundWire data output signal; and
a SoundWire slave circuit, comprising:
slave SoundWire circuitry comprising a slave receive interface and a slave transmit interface, the slave SoundWire circuitry configured to:
receive the SoundWire data input signal comprising the plurality of debug configuration bits in the plurality of assigned debug configuration bitslots over the SoundWire bus;
provide the SoundWire data input signal to the slave receive interface;
receive the SoundWire data output signal comprising the debug output bit in the assigned debug output bitslot from the slave transmit interface; and
transmit the SoundWire data output signal over the SoundWire bus; and
slave debug circuitry configured to:
receive the SoundWire data input signal from the slave receive interface;
generate the plurality of debug input bits based on the plurality of debug configuration bits in the plurality of assigned debug configuration bitslots; and
provide the SoundWire data output signal comprising the debug output bit in the assigned debug output bitslot to the slave transmit interface.

39. The electronic device of claim 38, wherein:
the SoundWire master circuit further comprises a master test access port (TAP); and
the master debug circuitry is further configured to receive the plurality of debug configuration bits from the master TAP and provide the debug output bit to the master TAP.

40. The electronic device of claim 39, wherein:
the SoundWire slave circuit further comprises a slave TAP; and
the slave debug circuitry is further configured to provide the plurality of debug input bits to the slave TAP and receive the debug output bit from the slave TAP.

41. A SoundWire slave circuit in an electronic device, the SoundWire slave circuit configured to:
receive a SoundWire data input signal comprising a plurality of debug configuration bits in a plurality of assigned debug configuration bitslots among a plurality of bitslots in a SoundWire frame over a SoundWire bus, wherein the plurality of assigned debug configuration bitslots is assigned to occupy a predetermined throughput of the SoundWire frame; and
transmit a SoundWire data output signal comprising a debug output bit in an assigned debug output bitslot among the plurality of bitslots in the SoundWire frame over the SoundWire bus.

42. A SoundWire master circuit in an electronic device, the SoundWire master circuit configured to:
transmit a SoundWire data input signal comprising a plurality of debug configuration bits in a plurality of assigned debug configuration bitslots among a plurality of bitslots in a SoundWire frame over a SoundWire bus, wherein the plurality of assigned debug configuration bitslots is assigned to occupy a predetermined throughput of the SoundWire frame; and
receive a SoundWire data output signal comprising a debug output bit in an assigned debug output bitslot among the plurality of bitslots in the SoundWire frame over the SoundWire bus.

* * * * *